United States Patent
Jing et al.

(10) Patent No.: US 11,245,490 B2
(45) Date of Patent: Feb. 8, 2022

(54) DATA ENCODING METHOD AND APPARATUS, DATA DECODING METHOD AND APPARATUS, OLT, ONU, AND PON SYSTEM

(71) Applicant: Huawei Technologies Co., Ltd., Shenzhen (CN)

(72) Inventors: Lei Jing, Wuhan (CN); Bo Gao, Wuhan (CN); Shiwei Nie, Dongguan (CN); Dekun Liu, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/889,053

(22) Filed: Jun. 1, 2020

(65) Prior Publication Data
US 2020/0295870 A1    Sep. 17, 2020

Related U.S. Application Data

(63) Continuation of application No. PCT/CN2018/118665, filed on Nov. 30, 2018.

(30) Foreign Application Priority Data

Dec. 1, 2017    (CN) .......................... 201711245941.1

(51) Int. Cl.
  *H04L 1/00*   (2006.01)
  *H03M 13/03*   (2006.01)
  *H04Q 11/00*   (2006.01)

(52) U.S. Cl.
  CPC .......... *H04L 1/0041* (2013.01); *H03M 13/03* (2013.01); *H04L 1/0061* (2013.01); *H04Q 11/0067* (2013.01)

(58) Field of Classification Search
  CPC ...... H03M 13/03; H03M 13/09; H03M 13/05; H03M 13/1515; H04L 1/0041;
  (Continued)

(56) References Cited

U.S. PATENT DOCUMENTS 8,281,228 B2 * 10/2012 Geng ................ H03M 13/6522
                                                              714/798
2003/0016705 A1    1/2003  Bellato et al.
(Continued)

FOREIGN PATENT DOCUMENTS

CN         1398064 A       2/2003
CN       101312349 A      11/2008
(Continued)

OTHER PUBLICATIONS

IEEE 802.3, Section1-6, "IEEE Standard for Ethernet," IEEE Std 802.3, 2015 (Revision of IEEE Std 802.3-2012), Sep. 3, 2015, 4017 pages.

*Primary Examiner* — Shelly A Chase
(74) *Attorney, Agent, or Firm* — Conley Rose, P.C.

(57) ABSTRACT

A data encoding method and apparatus and a data decoding method and apparatus in a passive optical network (PON) system include collecting N data blocks at a physical coding sublayer and generating valid data by combining the N data blocks, generating a payload, where the payload includes the valid data, performing FEC encoding on the payload to generate a check part, and generating a codeword structure. The synchronization header may be located at the head or the tail of the codeword structure.

19 Claims, 13 Drawing Sheets

(58) Field of Classification Search
CPC ... H04L 1/0061; H04L 1/0076; H04L 1/0057; H04L 1/0084; H04L 1/0023; H04L 1/0045
See application file for complete search history.

(56) References Cited

U.S. PATENT DOCUMENTS

| | | |
|---|---|---|
| 2008/0040643 A1 | 2/2008 | Effengerber |
| 2010/0070822 A1 | 3/2010 | Leung et al. |
| 2010/0070823 A1 | 3/2010 | Geng et al. |
| 2010/0199144 A1 | 8/2010 | Li et al. |
| 2013/0077962 A1* | 3/2013 | Wu .................. H04J 14/02 398/25 |
| 2014/0328593 A1* | 11/2014 | Lamb ................ H04M 11/062 398/66 |
| 2015/0046775 A1* | 2/2015 | Prodan ............... H04L 1/0076 714/776 |
| 2015/0288484 A1 | 10/2015 | Nie et al. |

FOREIGN PATENT DOCUMENTS

| | | |
|---|---|---|
| CN | 101455019 A | 6/2009 |
| CN | 101488827 A | 7/2009 |
| CN | 102891731 A | 1/2013 |
| JP | 2008085970 A | 4/2008 |
| JP | 2010500796 A | 1/2010 |
| JP | 2016510520 A | 4/2016 |
| KR | 101363541 B1 | 2/2014 |
| WO | 2008019611 A1 | 2/2008 |

* cited by examiner

DATA ENCODING METHOD AND APPARATUS, DATA DECODING METHOD AND APPARATUS, OLT, ONU, AND PON SYSTEM

CROSS-REFERENCE TO RELATED APPLICATION

This is a continuation of International Patent Application No. PCT/CN2018/118665 filed on Nov. 30, 2018, which claims priority to Chinese Patent Application No. 201711245941.1 filed on Dec. 1, 2017. The disclosures of the aforementioned applications are hereby incorporated by reference in their entireties.

TECHNICAL FIELD

The present disclosure relates to the field of optical communications, and in particular, to a data encoding method and apparatus and a data decoding method and apparatus in a passive optical network (PON) system, an optical line terminal (OLT), an optical network unit (ONU), and the PON system.

BACKGROUND

A PON technology is a point-to-multipoint optical fiber access technology. A PON system may include an OLT, an optical distribution network (ODN), and at least one ONU. The OLT is connected to the ODN, and the ODN is connected to a plurality of ONUs.

An Ethernet PON (EPON) technology is a favorable access technology with main features of easy maintenance, low costs, high transmission bandwidth, and a high price-performance ratio.

EPON is a passive optical transmission technology and does not use components having amplification and relay functions. Therefore, a transmission distance and a quantity of branches of an EPON network depend on a power budget and various transmission losses. With an increase in the transmission distance or the quantity of branches, a signal-to-noise ratio (SNR) for data transmission gradually decreases, causing more bit errors. To resolve this issue, a forward error correction (FEC) technology is introduced into an EPON system, to improve an anti-interference capability of the system and increase the power budget of the system.

In FEC coding, before being transmitted, a signal is preprocessed in a specific manner, and then is decoded at a receive end based on a corresponding algorithm, to find and correct error bits. A basic working principle of FEC coding in the EPON system is as follows. A FEC check codeword is attached after to-be-transmitted information data at a transmit end, where the check codeword is associated with (constrained by) to-be-checked information data according to a specified rule. The receive end checks the relationship between the information data and the check codeword according to the specified rule. Once an error occurs during transmission, the relationship is destroyed, and error bits can be found and corrected automatically. The FEC technology tries to correct a maximal quantity of errors using a minimal quantity of check bytes, to achieve a best balance between overheads (increase in check bytes) and obtained coding gains.

A FEC code type and a line code used in an existing 10 gigabits per second (10 G) EPON and 1 G EPON have the disadvantages of having a complex synchronization process and a low synchronization speed.

SUMMARY

In view of this, this application provides a data encoding method and apparatus, a data decoding method and apparatus, and a precoding indication method and apparatus in a PON system, an OLT, an ONU, and a PON system, to simplify a synchronization process and implement fast synchronization.

According to a first aspect, a data encoding method in a PON system is provided, where the method may be performed by a network device in the PON system. For example, an OLT may perform encoding if the OLT sends data to an ONU, or an ONU may perform encoding if the ONU sends data to an OLT. The encoding method is performed at a physical coding sublayer, and the method includes collecting N data blocks at the physical coding sublayer and generating valid data by combining the N data blocks, where N is an integer and is less than or equal to a quotient obtained by dividing a payload length value corresponding to a FEC code type by a length of the collected data block (that is, N is less than or equal to a ratio of the payload length value of the FEC code type to the length of the data block), and a FEC codeword length value and the payload length value are correspondingly set for the FEC code type, generating a payload at the physical coding sublayer, where the payload includes the valid data, and a length of the payload is equal to the payload length value of the FEC code type, performing FEC encoding on the payload based on the FEC code type, to generate a check part, where a length of the check part is equal to a difference between the FEC codeword length value and the payload length value, and generating a codeword structure at the physical coding sublayer, where the codeword structure includes the valid data, the check part, and a synchronization header, and the valid data, the check part, and the synchronization header are independently distributed in the codeword structure. This can implement fast and simple synchronization because the synchronization header can be quickly located.

The synchronization header may be located at the head or the tail of the codeword structure, to further implement fast synchronization. The synchronization header may alternatively be located between the valid data and the check part.

The collected data block may be a 128 bit (b)/129 b or 256 b/257 b data block, and the data block that is input to the physical coding sublayer may be a 64 b/66 b or 64 b/65 b data block. In this case, the physical coding sublayer needs to transcode the input 64 b/66 b or 64 b/65 b data block into a 128 b/129 b or 256 b/257 b data block. Encoding overheads are reduced through transcoding, and bandwidth efficiency can be effectively improved.

Alternatively, the collected data block may be a 64 b/66 b or 64 b/65 b data block.

A FEC code type is low-density parity-check (LDPC) (18493, 15677), Reed-Solomon (RS) (2047, 1739), RS (1023, 847), RS (1023, 845), RS (1023, 843), RS (1023, 841), RS (1015, 839), RS (1017, 839), or RS (1019, 839). An error correction capability can be improved.

The FEC codeword length value is equal to a sum of the payload length value and a check length value. To be specific, check bits whose quantity is the check length value are generated after FEC encoding is performed on valid bits whose quantity is the payload length value, and a sum of a length of the valid bits and a length of the check bits is equal to the FEC codeword length value.

When a length of the valid data is equal to the payload length value, the payload consists of the valid data. All the payload is the valid data, and therefore encoding efficiency and bandwidth efficiency are high.

The length of the valid data may alternatively be less than the payload length value of the used FEC code type, and the codeword structure further includes a padding part. In this case, the payload consists of the valid data and the padding part. The length of the payload is equal to the payload length value of the used FEC code type. That is, a length of the padding part may be equal to a difference between the payload length value and the length of the valid data. The length of the padding part may alternatively be equal to a remainder obtained by dividing the payload length value by the length of the collected data block. By adding a padding field, effective compatibility and adaption can be implemented between various FEC code types and line codes.

To ensure that an input rate and an output rate remain unchanged, a length of the synchronization header may be calculated in the following manner. If the length of the synchronization header is S, a length of the input data block is X, and a remainder obtained by dividing the FEC codeword length value by X is Y, $S=tX-Y$, where t is an integer, and when $Y\neq 0$, $t\geq 1$, or when $Y=0$, $t\geq 0$.

When $Y=0$ and $t=0$, $S=0$. In this case, the padding part may be used as the synchronization header. The entire padding part may be used as the synchronization header, or some bits in the padding part may be used as the synchronization header. Additional bits are not required, but instead the padding part is directly used as the synchronization header. This effectively reduces bits of invalid data and improves bandwidth efficiency and encoding efficiency.

The padding part may further be used to indicate a length of the codeword structure, the length of the valid data, a sum of the length of the valid data and the length of the check part, the length of the payload, or a sum of the length of the payload and the length of the check part. The padding part may indicate a codeword structure in which the padding part is located, or may indicate a next codeword structure or another codeword structure. Alternatively, the codeword structure may further include an indication part. The indication part is used to indicate the length of the codeword structure, the length of the valid data, the sum of the length of the valid data and the length of the check part, the length of the payload, or the sum of the length of the payload and the length of the check part. The indication part may indicate a codeword structure in which the indication part is located, or may indicate a next codeword structure or another codeword structure. Some bits in the synchronization header may be used for indication. The padding part or the indication part enables a target network device to learn of the length of the codeword structure, to implement correct parsing.

It may be understood that the foregoing implementation details may be combined. For example, the codeword structure may include both the padding part and the indication part, and some or all bits in the padding part are used as a synchronization header. Alternatively, the codeword structure may include both the padding part and a synchronization header, and some or all bits of the padding part are used as a synchronization header. In this case, there are two synchronization headers. Alternatively, some bits in the padding part are used as a synchronization header, and the other bits are used to indicate the length of the codeword structure, the length of the valid data, the sum of the length of the valid data and the length of the check part, the length of the payload, or the sum of the length of the payload and the length of the check part. In this case, the foregoing additional synchronization header may or may not be included.

According to a second aspect, a data decoding method in a PON system is provided, where the method may be performed by a network device in the PON system. For example, an ONU may perform decoding if an OLT sends data to the ONU, or an OLT may perform decoding if an ONU sends data to the OLT. The decoding method is performed at a physical coding sublayer, and the method includes receiving a codeword structure at a physical coding sublayer, where the codeword structure includes valid data, a check part, and a synchronization header, the valid data, the check part, and the synchronization header are independently distributed in the codeword structure, the valid data includes N data blocks, N is an integer and is less than or equal to a ratio of a payload length value corresponding to a FEC code type to a length of the data block, a FEC codeword length value and the payload length value are correspondingly set for the FEC code type, and a length of the check part is equal to a difference between the FEC codeword length value and the payload length value, synchronizing, at the physical coding sublayer, the received codeword structure based on the synchronization header, extracting a payload and the check part, where the payload includes the valid data, and a length of the payload is equal to the payload length value, and performing FEC decoding on the payload based on the FEC code type. Because the valid data, the check part, and the synchronization header are independently distributed in the codeword structure, fast synchronization can be implemented, and bandwidth efficiency and an error correction capability can be improved.

According to a third aspect, a precoding indication method in a PON system is provided. The method may be performed by a physical coding sublayer of an OLT, or may be performed by a physical coding sublayer of an ONU. The method includes adding, by the physical coding sublayer to a synchronization header, indication information indicating whether a codeword structure is precoded. A bit at a preset location in the synchronization header may be used as the indication information. The specific location may be agreed upon by a source network device and a target network device. For example, if the last bit in the synchronization header is "0", it indicates that the codeword structure is precoded, if the last bit in the synchronization header is "1", it indicates that the codeword structure is not precoded. The method further includes generating, by the physical coding sublayer, the codeword structure, where the codeword structure includes a payload, check data, and the synchronization header, and sending, by the physical coding sublayer, the codeword structure. In this way, the target network device can determine, based on the indication information, whether the codeword structure is precoded.

According to a fourth aspect, a precoding indication method in a PON system is provided. The method may be performed by a physical coding sublayer of an OLT, or may be performed by a physical coding sublayer of an ONU. The method includes receiving, by the physical coding sublayer, a codeword structure, where the codeword structure includes a payload, check data, and a synchronization header, and the synchronization header includes indication information used to indicate whether the codeword structure is precoded, and determining, by the physical coding sublayer based on the indication information in the synchronization header, whether the codeword structure is precoded.

A target network device may determine, through blind detection, whether the received codeword structure is precoded. The target network device may prestore a first synchronization sequence and a second synchronization sequence. The first synchronization sequence may be an original synchronization sequence for the codeword structure before precoding, and the second synchronization sequence may be an output synchronization sequence for the codeword structure after precoding. If the synchronization header matches the first synchronization sequence, it is determined that the codeword structure is not precoded. In this case, the target network device directly extracts valid data and a check part from the codeword structure. If the synchronization header matches the second synchronization sequence, it is determined that the codeword structure is precoded. The target network device de-precodes the codeword structure, and the target network device extracts valid data and a check part from a de-precoded codeword structure. The indication information indicating whether the codeword structure is precoded is added to the synchronization header such that the target network device can further determine, based on the information, whether a previous blind detection result is correct, to make a double check.

According to a fifth aspect, a precoding indication method in a PON system is provided. The method may be performed by a media access control (MAC) sublayer or a processor of an OLT, or may be performed by an ONU or a MAC sublayer of an ONU. The method includes generating, by a source network device, a data frame, where the data frame includes indication information that is used to indicate whether the source network device has a precoding capability, or used to indicate whether a target network device needs to perform precoding or de-precoding, or used to indicate the target network device to enable or disable a precoding enable bit, and sending, by the source network device, the data frame to the target network device. In this way, the target network device may determine, based on the indication information, whether to perform precoding and de-precoding.

The source network device may be an ONU, and the target network device may be an OLT. The data frame carries a registration request message, and the registration request message includes indication information used to indicate whether the ONU has a precoding capability. The indication information indicating whether the source network device has a precoding capability is added to the data frame, to notify the target network device whether the data frame sent by the source network device needs to be de-precoded, and whether the data frame to be sent to the source network device needs to be precoded.

The source network device may be an OLT, and the target network device may be an ONU. The data frame carries a discovery gate message, and the discovery gate message includes indication information used to indicate whether the ONU needs to perform precoding or de-precoding. Further, the OLT may indicate whether a message sent to the ONU in the downstream is precoded, that is, indicate whether the ONU needs to de-precode the data received in the downstream, and may further indicate whether upstream data to be sent by the ONU to the OLT in the upstream needs to be precoded. Indication information indicating whether the data frame is precoded is added to the data frame such that the target network device can further determine, based on the information, whether a previous blind detection result is correct, to make a double check. In addition, whether precoding is required in the upstream or the downstream is indicated such that the source network device and the target network device may perform precoding and de-precoding based on the indication. This avoids an error and improves efficiency.

The source network device may be an OLT, and the target network device may be an ONU. The data frame carries a registration message, and the registration message includes the indication information used to indicate the ONU to enable or disable a precoding enable bit. After receiving the indication information, the ONU enables or disables the precoding enable bit.

According to a sixth aspect, a precoding indication method in a PON system is provided. The method may be performed by a MAC sublayer or a processor of an OLT, or may be performed by an ONU or a MAC sublayer of an ONU. The method includes receiving, by a target network device, a data frame sent by a source network device, where the data frame includes indication information used to indicate whether the data frame is precoded, whether the source network device has a precoding capability, or whether the target network device needs to perform precoding or de-precoding, and determining, by the target network device based on the indication information, whether to de-precode the data frame, or whether to precode and de-precode the data frame transmitted to/from the source network device.

According to a seventh aspect, a data encoding apparatus in a PON system is provided. The apparatus includes a collection module configured to collect N data blocks and generate valid data by combining the N data blocks, where N is an integer and is less than or equal to a ratio of a payload length value corresponding to a FEC code type to a length of the data block, and a FEC codeword length value and the payload length value are correspondingly set for the FEC code type, a generation module configured to generate a payload, where the payload includes the valid data, and a length of the payload is equal to the payload length value, and a FEC encoding module configured to perform FEC encoding on the payload based on the FEC code type, to generate a check part, where the length of the payload is equal to the payload length value, and a length of the check part is equal to a difference between the FEC codeword length value and the payload length value. The generation module is further configured to generate a codeword structure, where the codeword structure includes the valid data, the check part, and a synchronization header, and the valid data, the check part, and the synchronization header are independently distributed in the codeword structure, to implement fast synchronization and improve bandwidth efficiency and an error correction capability.

According to an eighth aspect, a data decoding apparatus in a PON system is provided. The apparatus includes a receiving module configured to receive a codeword structure, where the codeword structure includes valid data, a check part, and a synchronization header, the valid data, the check part, and the synchronization header are independently distributed in the codeword structure, a FEC codeword length value and a payload length value are correspondingly set for a used FEC code type, the valid data includes N data blocks, N is an integer and is less than or equal to a ratio of a payload length value corresponding to a FEC code type to a length of the data block, a FEC codeword length value and a payload length value are correspondingly set for the FEC code type, and a length of the check part is equal to a difference between the FEC codeword length value and the payload length value, a synchronization module configured to synchronize the received codeword structure based on the synchronization header, an extraction module configured to extract a payload and the check part, where the payload includes the valid data, and a length of the payload is equal to the payload length value, and a FEC decoding module configured to perform FEC decoding on the payload based on the FEC code type. Because the valid data, the check part, and the synchronization header are independently distributed in the codeword structure, fast synchronization can be implemented, and bandwidth efficiency and an error correction capability can be improved.

According to a ninth aspect, a precoding indication apparatus in a PON system is provided. The apparatus includes an adding module configured to add indication information indicating whether a codeword structure is precoded to a synchronization header, a generation module configured to generate the codeword structure, where the codeword structure includes a payload, check data, and the synchronization header, and a sending module configured to send the codeword structure. In this way, a network device that receives the codeword structure can determine, based on the indication information, whether the codeword structure is precoded.

According to a tenth aspect, a precoding indication apparatus in a PON system is provided. The apparatus includes a receiving module configured to receive a codeword structure, where the codeword structure includes a payload, check data, and a synchronization header, and the synchronization header includes indication information used to indicate whether the codeword structure is precoded, and a determining module configured to determine, based on the indication information in the synchronization header, whether the codeword structure is precoded. The indication information indicating whether the codeword structure is precoded is added to the synchronization header such that a target network device can further determine, based on the information, whether a previous blind detection result is correct, to make a double check.

According to an eleventh aspect, a precoding indication apparatus in a PON system is provided. The apparatus includes a generation module configured to generate a data frame, where the data frame includes indication information used to indicate whether the data frame is precoded, whether the apparatus has a precoding capability, or whether a target network device needs to perform precoding or de-precoding, and a sending module configured to send the data frame to the target network device. In this way, the target network device may determine, based on the indication information, whether to perform precoding and de-precoding.

According to a twelfth aspect, a precoding indication apparatus in a PON system is provided. The apparatus includes a receiving module configured to receive a data frame sent by a source network device, where the data frame includes indication information used to indicate whether the data frame is precoded, whether the source network device has a precoding capability, or whether the apparatus needs to perform precoding or de-precoding, and a determining module configured to determine, based on the indication information, whether to de-precode the data frame, or whether to precode and de-precode the data frame transmitted to/from the source network device.

According to a thirteenth aspect, a network device is provided. The network device may be an OLT or an ONU. The network device may include a chip, and the chip may be a MAC chip. The chip is configured to collect N data blocks at a physical coding sublayer and generate valid data by combining the N data blocks, where N is an integer and is less than or equal to a ratio of a payload length value corresponding to a FEC code type to a length of the data block, and a FEC codeword length value and the payload length value are correspondingly set for the FEC code type, generate a payload at the physical coding sublayer, where the payload includes the valid data, and a length of the payload is equal to the payload length value, perform FEC encoding on the payload at the physical coding sublayer based on the FEC code type, to generate a check part, where a length of the check part is equal to a difference between the FEC codeword length value and the payload length value, and generate a codeword structure at the physical coding sublayer, where the codeword structure includes the valid data, the check part, and a synchronization header, and the valid data, the check part, and the synchronization header are independently distributed in the codeword structure, to implement fast synchronization and improve bandwidth efficiency and an error correction capability.

According to a fourteenth aspect, a network device is provided. The network device may be an OLT or an ONU. The network device may include a chip, and the chip may be a MAC chip. The chip is configured to receive a codeword structure at a physical coding sublayer, where the codeword structure includes valid data, a check part, and a synchronization header, the valid data, the check part, and the synchronization header are independently distributed in the codeword structure, the valid data includes N data blocks, N is an integer and is less than or equal to a ratio of a payload length value corresponding to a FEC code type to a length of the data block, a FEC codeword length value and the payload length value are correspondingly set for the FEC code type, and a length of the check part is equal to a difference between the FEC codeword length value and the payload length value, synchronize, at the physical coding sublayer, the received codeword structure based on the synchronization header, extract a payload and the check part, where the payload includes the valid data, and a length of the payload is equal to the payload length value, and perform FEC decoding on the payload based on the FEC code type. Because the valid data, the check part, and the synchronization header are independently distributed in the codeword structure, fast synchronization can be implemented, and bandwidth efficiency and an error correction capability can be improved. The network device may include a chip, the chip may be a MAC chip, and the MAC chip includes the physical coding sublayer.

According to a fifteenth aspect, a network device is provided. The network device may be an OLT or an ONU. The network device includes a physical coding sublayer. The physical coding sublayer adds, to a synchronization header, indication information indicating whether a codeword structure is precoded. A bit at a preset location in the synchronization header may be used as the indication information. The specific location may be agreed upon by a source network device and a target network device. For example, if the last bit in the synchronization header is "0", it indicates that the codeword structure is precoded, if the last bit in the synchronization header is "1", it indicates that the codeword structure is not precoded. The physical coding sublayer generates the codeword structure, where the codeword structure includes a payload, check data, and the synchronization header, and the physical coding sublayer sends the codeword structure. In this way, the target network device can determine, based on the indication information, whether the codeword structure is precoded. The network device may include a chip, the chip may be a MAC chip, and the MAC chip includes the physical coding sublayer.

According to a sixteenth aspect, a network device is provided. The network device may be an OLT or an ONU. The network device includes a physical coding sublayer. The physical coding sublayer receives a codeword structure, where the codeword structure includes a payload, check data, and a synchronization header, and the synchronization header includes indication information used to indicate whether the codeword structure is precoded, and the physical coding sublayer determines, based on the indication information in the synchronization header, whether the codeword structure is precoded. The network device may include a chip, the chip may be a MAC chip, and the MAC chip includes the physical coding sublayer.

According to a seventeenth aspect, a network device is provided. The network device may be an OLT or an ONU. The network device includes a MAC sublayer, a processor, and a transceiver. The MAC sublayer or the processor generates a data frame, where the data frame includes indication information that is used to indicate whether the network device has a precoding capability, or used to indicate whether a target network device needs to perform precoding or de-precoding, or used to indicate the target network device to enable or disable a precoding enable bit. The transceiver sends the data frame to the target network device. In this way, the target network device may determine, based on the indication information, whether to perform precoding and de-precoding.

According to an eighteenth aspect, a network device is provided. The network device may be an OLT or an ONU. The network device includes a MAC sublayer, a processor, and a transceiver. The transceiver receives a data frame sent by a source network device, where the data frame includes indication information used to indicate whether the data frame is precoded, whether the source network device has a precoding capability, or whether the network device needs to perform precoding or de-precoding. The MAC sublayer or the processor determines, based on the indication information, whether to de-precode the data frame, or whether to precode and de-precode the data frame transmitted to/from the source network device.

It may be understood that different embodiments have different claimed subject matters, but mutual reference may be made to specific implementation details. For some claimed subject matters without implementation details, reference may be made to other subject matters.

According to a nineteenth aspect, an OLT is provided. The OLT includes the apparatus according to any one of the seventh to the twelfth aspects, or the network device according to any one of the thirteenth to the eighteenth aspects.

According to a twentieth aspect, an ONU is provided, where the ONU includes the apparatus according to any one of the seventh to the twelfth aspects, or the network device according to any one of the thirteenth to the eighteenth aspects.

According to another aspect of this application, a codeword structure is provided. The codeword structure includes a payload, a check part, and a synchronization header. The check part is generated after FEC encoding is performed on the payload, where the payload includes valid data. The valid data includes N data blocks, a FEC codeword length value and a payload length value are correspondingly set for each FEC code type, and N is an integer and is less than or equal to a quotient obtained by dividing the payload length value by a length of the data block. A length of the payload is equal to the payload length value, and a length of the check part is equal to a difference between the FEC codeword length value and the payload length value. The valid data, the check part, and the synchronization header are independently distributed in the codeword structure.

For specific details of the synchronization header, the data block, the FEC code type, the codeword structure, and the like, refer to other aspects. Details are not described herein again.

According to still another aspect of this application, a MAC chip is provided. The MAC chip includes the apparatus according to any one of the seventh to the twelfth aspects.

According to yet another aspect of this application, a PON system is provided. The system includes the OLT according to the nineteenth aspect and the ONU according to the twentieth aspect.

According to still yet another aspect of this application, a computer-readable storage medium is provided. The computer-readable storage medium stores a computer software instruction used by the apparatus according to any one of the seventh to the twelfth aspects, or stores a computer software instruction used by the network device according to any one of the thirteenth to the eighteenth aspects. When the computer software instruction is run on a computer, the computer is enabled to perform the methods according to the foregoing aspects.

DESCRIPTION OF EMBODIMENTS

To make the disclosure objectives, features, and advantages of the present disclosure clearer and more comprehensible, the following clearly and describes the technical solutions in embodiments of the present disclosure with reference to the accompanying drawings in the embodiments of the present disclosure. Certainly, the embodiments described in the following are merely some rather than all of the embodiments of the present disclosure. All other embodiments obtained by a person of ordinary skill in the art based on the embodiments of the present disclosure without creative efforts shall fall within the protection scope of the present disclosure.

The technical solutions in the embodiments of the present disclosure may be applied to various EPON and gigabit-capable PONs (GPONs), for example, a 10 G EPON, a single-wavelength 25 G EPON, a 2×25 G EPON, a single-wavelength 50 G EPON, a 2×50 G EPON, and a 100 G EPON, and various GPONs.

Figure 1:
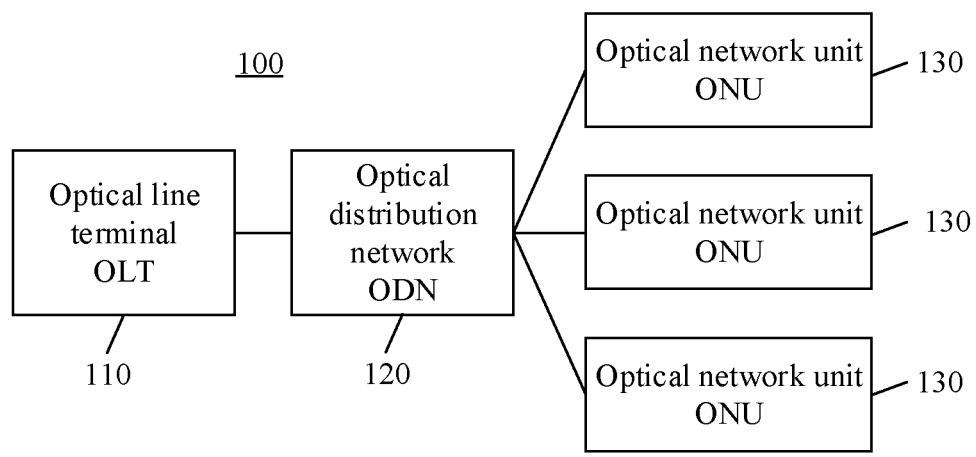
FIG. 1 is a schematic architectural diagram of a PON system according to an embodiment of the present disclosure.

FIG. 1 is a schematic architectural diagram of a PON system applicable to the embodiments of the present disclosure. As shown in FIG. 1, the PON system 100 includes at least one OLT 110, at least one ODN 120, and a plurality of ONUs 130. The OLT 110 provides a network-side interface for the PON system 100, and the ONU 130 provides a user-side interface for the PON system 100 and is connected to the ODN 120. If the ONU 130 directly provides a user port function, the ONU 130 is referred to as an optical network terminal (ONT). For ease of description, the ONU 130 mentioned below is used as an umbrella term covering the ONT that can directly provide the user port function and the ONU that can provide the user-side interface. The ODN 120 is a network including an optical fiber and a passive optical splitter, the ODN is configured to connect the OLT 110 device and the ONU 130 device, and is configured to distribute or multiplex a data signal between the OLT 110 and the ONU 130.

In the PON system 100, a direction from the OLT 110 to the ONU 130 is defined as a downstream direction, and a direction from the ONU 130 to the OLT 110 is defined as an upstream direction. In the downstream direction, the OLT 110 broadcasts downstream data to the plurality of ONUs 130 managed by the OLT 110 in a time division multiplexing (TDM) mode, and each ONU 130 receives only data that carries an identifier of the ONU 130. In the upstream direction, the plurality of ONUs 130 communicate with the OLT 110 in a time-division multiple access (TDMA) mode, and each ONU 130 sends upstream data using a time domain resource allocated by the OLT 110 to the ONU 130. According to the foregoing mechanism, a downstream optical signal sent by the OLT 110 is a continuous optical signal, and an upstream optical signal sent by the ONU 130 is a burst optical signal.

The OLT 110 is usually located in a central office (CO), and can manage at least one ONU 130 indiscriminately and transmit data between the ONU 130 and an upper-layer network. Further, the OLT 110 may serve as an intermediary between the ONU 130 and the upper-layer network (for example, the internet or a public switched telephone network (PSTN)), to forward data received from the upper-layer network to the ONU 130 and forward data received from the ONU 130 to the upper-layer network. A specific structure configuration of the OLT 110 may vary with a specific type of the PON system 100. For example, in an embodiment, the OLT 110 may include a transmitter and a receiver. The transmitter is configured to send a continuous downstream optical signal to the ONU 130, and the receiver is configured to receive a burst upstream optical signal from the ONU 130. The downstream optical signal and the upstream optical signal may be transmitted via the ODN 120. However, the embodiments of the present disclosure are not limited by this example.

The ONUs 130 may be distributed in user-side locations (for example, customer premises). The ONU 130 may be a network device configured to communicate with the OLT 110 and a user. Further, the ONU 130 may serve as an intermediary between the OLT 110 and the user. For example, the ONU 130 may forward data received from the OLT 110 to the user and forward data received from the user to the OLT 110.

The ODN 120 may be a data distribution network and may include an optical fiber, an optical coupler, an optical splitter, or another device. In an embodiment, the optical fiber, the optical coupler, the optical splitter, or the other device may be a passive optical component. Further, the optical fiber, the optical coupler, the optical splitter, or the other device may be a component that does not need to be powered to distribute data signals between the OLT 110 and the ONU 130. Further, an optical splitter is used as an example. The optical splitter may be connected to the OLT 110 through a feeder fiber, and connected to the plurality of ONU 130s through a plurality of distribution fibers, to implement a point-to-multipoint connection between the OLT 110 and the ONUs 130. In addition, in another embodiment, the ODN 120 may further include one or more processing devices, for example, an optical amplifier or a relay device. In addition, the ODN 120 may further extend from the OLT 110 to the plurality of ONUs 130, or may be configured in any other point-to-multipoint structure. This is not limited in the embodiments of the present disclosure.

In the technical solution of the embodiment of the present disclosure described below, the OLT 110 may perform encoding to generate a codeword structure, and send the codeword structure to the ONU 130 such that the ONU 130 decodes the codeword structure. Alternatively, the ONU 130 may encode a codeword structure, and send the codeword structure to the OLT 110 such that the OLT 110 decodes the codeword structure. For ease of description, one of the OLT 110 and the ONU 130 that is used as a transmitter is referred to as a source network device, and the other that is used as a receiver is referred to as a target network device.

Figure 2:
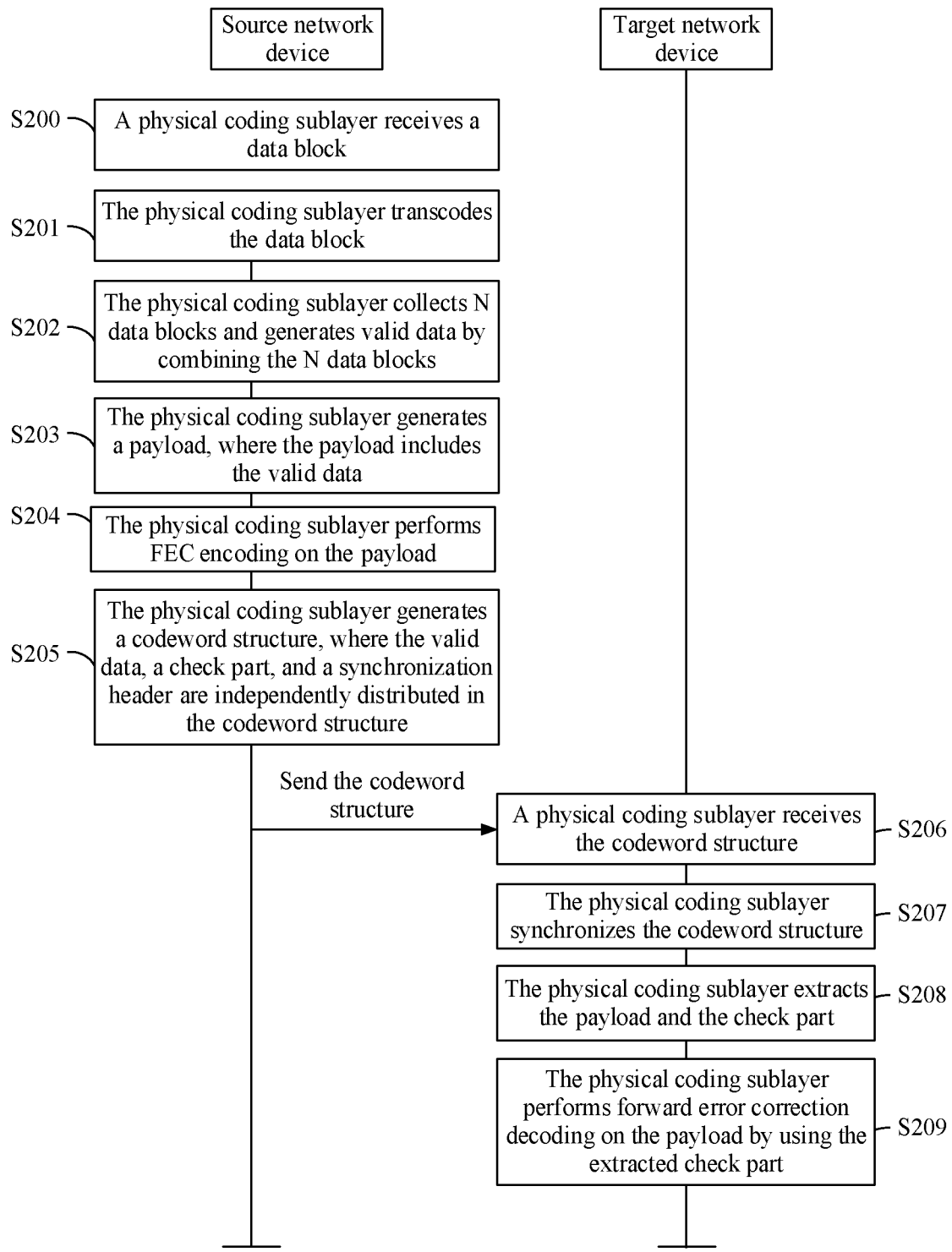
FIG. 2 is an example flowchart of a data encoding and decoding method according to an embodiment of the present disclosure.

Therefore, the following provides a data encoding and decoding method. The following describes in detail the data encoding and decoding method provided in this embodiment of the present disclosure with reference to the accompanying drawings. As shown in FIG. 2, the method includes steps S200 to S209. Specific implementations of the steps are as follows.

S200. A physical coding sublayer of a source network device receives an input 64 b/66 b or 64 b/65 b data block.

In this embodiment, the input data block is data content that needs to be transmitted. The physical coding sublayer is also referred to as a PCS.

A total length of the 64 b/66 b data block is 66 bits, including 64-bit data, and 2-bit indication information used to indicate whether the 64-bit data in the data block is data information or control information. The 2-bit indication information may be located at the head or the tail of the data block.

Likewise, a total length of the 64 b/65 b data block is 65 bits, including 64-bit data, and 1-bit indication information used to indicate whether the 64-bit data in the data block is data information or control information. The 1-bit indication information may be located at the head or the tail of the data block.

Likewise, a 128 b/129 b data block and a 256 b/257 b data block described in the following embodiments are similar to the foregoing data blocks, and details are not described herein again.

S201. The physical coding sublayer of the source network device transcodes the input 64 b/66 b or 64 b/65 b data block into a 128 b/129 b or 256 b/257 b data block. Step S201 is an optional step. If a data block collected in step S202 is the 64 b/66 b or 64 b/65 b data block, step S201 may be omitted.

If a data block collected in step S202 is the 128 b/129 b or 256 b/257 b data block, step S201 may be performed.

Transcoding the 64 b/66 b data block into the 128 b/129 b data block is shown in FIG. 3A to FIG. 3D. Every two 64 b/66 b data blocks are transcoded into one 128 b/129 b data block.

The 64 b/66 b data block is classified into two types: a data block carrying data information and a data block carrying control information. Using FIG. 3A to FIG. 3D as an example, if 2-bit indication information in the data block is "01", it indicates that 64-bit data in the data block is data information. If 2-bit indication information in the data block is "10", it indicates that 64-bit data in the data block is control information.

Figure 3A:
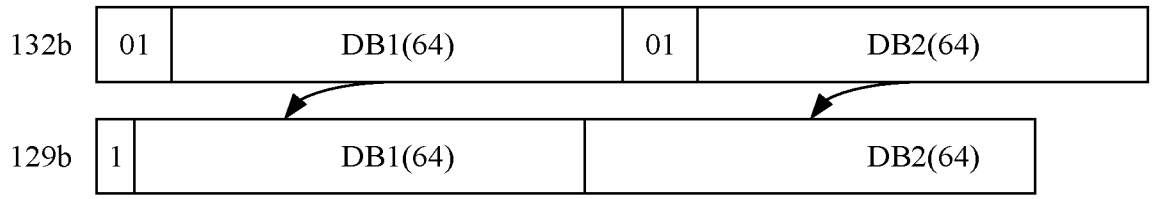
FIG. 3A is a schematic diagram of data block transcoding according to an embodiment of the present disclosure.

As shown in FIG. 3A, two 64 b/66 b data blocks carrying data information are transcoded into one 128 b/129 b data block. 2-bit indication information in each of the two 64 b/66 b data blocks may be removed, and 1-bit indication information is added to indicate a data type (including two types: data information and control information) of 128-bit data carried in the transcoded data block. As shown in FIG. 3A, DB1(64) and DB2(64) represent 64-bit data information in the two data blocks.

Figure 3B:
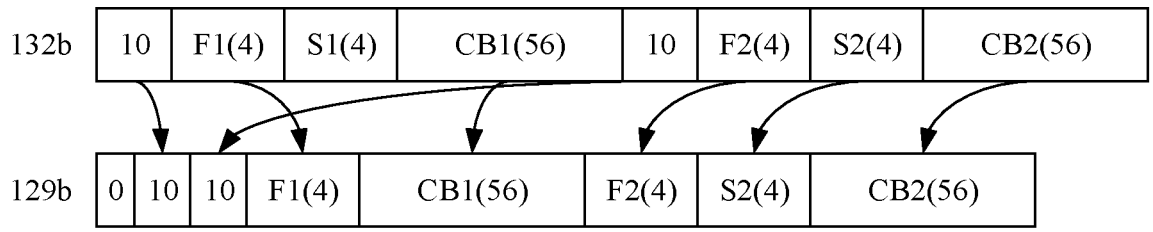
FIG. 3B is another schematic diagram of data block transcoding according to an embodiment of the present disclosure.

As shown in FIG. 3B, two 64 b/66 b data blocks carrying control information are transcoded into one 128 b/129 b data block. The 64 b/66 b data blocks carrying control information include 4-bit S1(4). The 4-bit S1(4) in one of the data blocks may be deleted, 2-bit indication information is retained in the two 64 b/66 b data blocks, and additional 1 bit is added. An arrangement rule of pieces of information in the transcoded 129-bit data block may be set according to an actual requirement, to implement interworking. Using FIG. 3B as an example, the additional 1 bit is placed at the head of the data block, followed sequentially by the respective 2-bit indication information of the two 64 b/66 b data blocks, the control information in the 64 b/66 b data block from which the 4-bit S1(4) is removed, and the control information in the 64 b/66 b data block from which the 4 bit S1(4) is not removed. It may be understood that, another arrangement may alternatively be used.

Figure 3C:
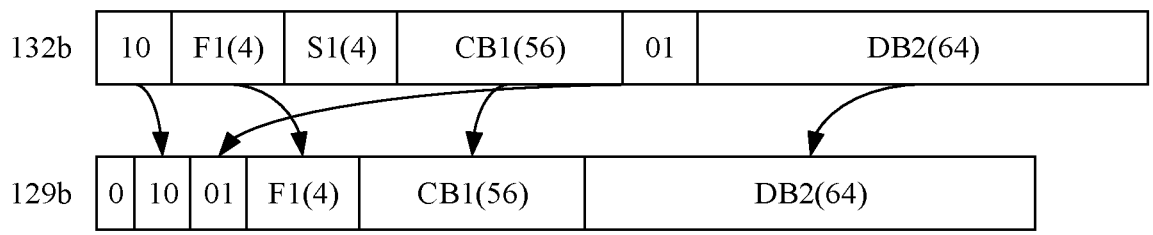
FIG. 3C is still another schematic diagram of data block transcoding according to an embodiment of the present disclosure.

As shown in FIG. 3C, one 64 b/66 b data block carrying control information and one 64 b/66 b data block carrying data information are transcoded into one 128 b/129 b data block. The 64 b/66 b data block carrying the control information includes 4-bit S1(4). The 4-bit S1(4) in the data block may be deleted, 2-bit indication information is retained in the two 64 b/66 b data blocks, and additional 1 bit is added. An arrangement rule of pieces of information in the transcoded 129-bit data block may be set according to an actual requirement, to implement interworking. Using FIG. 3C as an example, the additional 1 bit is placed at the head of the data block, followed sequentially by the respective 2-bit indication information of the 64 b/66 b data block carrying the control information and the 64 b/66 b data block carrying the data information, the control information in the 64 b/66 b data block from which the 4-bit S1(4) is removed, and the data information in the 64 b/66 b data block carrying the data information. It may be understood that, another arrangement may alternatively be used.

Figure 3D:
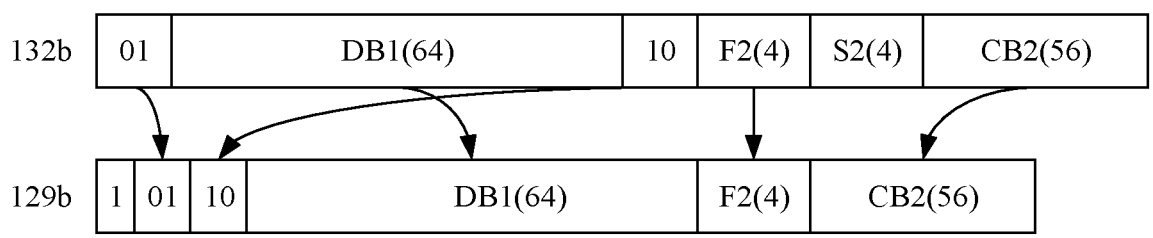
FIG. 3D is yet another schematic diagram of data block transcoding according to an embodiment of the present disclosure.

As shown in FIG. 3D, one 64 b/66 b data block carrying data information and one 64 b/66 b data block carrying control information are transcoded into one 128 b/129 b data block. Different from FIG. 3C, additional 1 bit is placed at the head of the data block, followed sequentially by respective 2-bit indication information of the 64 b/66 b data block carrying the data information and the 64 b/66 b data block carrying the control information, the data information in the 64 b/66 b data block carrying the data information, and the control information in the 64 b/66 b data block from which 4-bit S1(4) is removed. It may be understood that, another arrangement may alternatively be used.

Figure 3E:
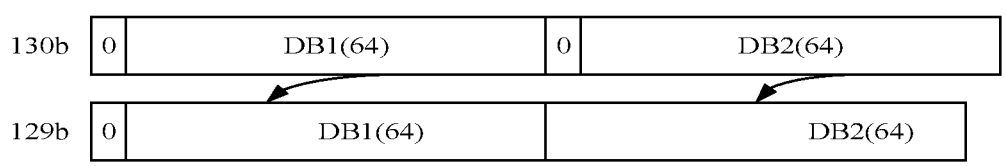
FIG. 3E is still yet another schematic diagram of data block transcoding according to an embodiment of the present disclosure.

As shown in FIG. 3E, two 64 b/65 b data blocks carrying data information are transcoded into one 128 b/129 b data block. 1-bit indication information in each of the two 64 b/65 b data blocks may be removed, and 1-bit indication information is added to indicate a data type (including two types data information and control information) of 128-bit data carried in the transcoded data block. As shown in FIG. 3E, DB1(64) and DB2(64) represent 64-bit data information in the two data blocks.

Figure 3F:
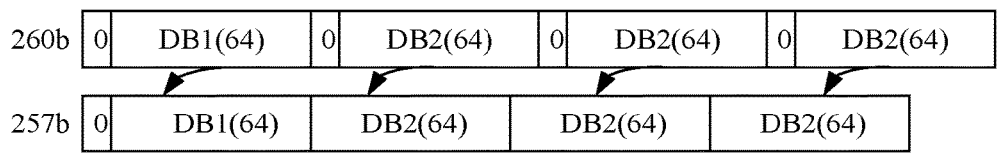
FIG. 3F is a further schematic diagram of data block transcoding according to an embodiment of the present disclosure.

As shown in FIG. 3F, four 64 b/65 b data blocks carrying data information are transcoded into one 256 b/257 b data block. 1-bit indication information in each of the four 64 b/65 b data blocks may be removed, and 1-bit indication information is added to indicate a data type (including two types: data information and control information) of 256-bit data carried in the transcoded data block. As shown in FIG. 3F, DB1(64), DB2(64), DB3(64), and DB4(64) represent 64-bit data information in the four data blocks.

In a case of transcoding the 64 b/66 b data block into the 256 b/257 b data block, every four 64 b/66 b data blocks are transcoded into one 256 b/257 b data block. A specific transcoding principle is similar to the foregoing description. Valid data information and control information may be retained, the indication information or S1(4) may be removed, and one or more additional bits may be added. In conclusion, valid data is not lost in the transcoded data block, and a total quantity of bits is 256.

For a specific implementation solution of transcoding the 64 b/65 b data block into the 128 b/129 b or 256 b/257 b data block, refer to the foregoing transcoding solution of the 64 b/66 b data block. Details are not described herein again.

Bandwidth efficiency can be effectively improved through transcoding.

In an embodiment, the data block may be further scrambled after transcoding, and the data block collected in step S202 is a scrambled data block.

S202. The physical coding sublayer of the source network device collects N data blocks and generates the valid data by combining the N data blocks.

The N data blocks collected by the source network device may be 256 b/257 b data blocks (that is, a line code is 256 b/257 b), or 128 b/129 b data blocks (that is, a line code is 128 b/129 b), or 64 b/66 b data blocks (that is, a line code is 64 b/66 b), or 64 b/65 b data blocks (that is, a line code is 64 b/65 b). Lengths of the collected N data blocks are the same. That is, the N data blocks are all 256 b/257 b data blocks, or all 128 b/129 b data blocks, or all 64 b/66 b data blocks, or all 64 b/65 b data blocks.

S203. The physical coding sublayer generates a payload, where the payload includes the valid data.

S204. The physical coding sublayer of the source network device performs FEC encoding on the payload to generate a check part. A FEC codeword value and a payload value are correspondingly set for each FEC code type, where N is an integer and is less than or equal to a quotient obtained by dividing the payload value by the length of the collected data block (that is, N is less than or equal to a ratio of the payload value to the length of the data block). A length of the payload is equal to the payload value, and a length of the check part is equal to a difference between the FEC codeword value and the payload value.

S205. The physical coding sublayer of the source network device generates a codeword structure, where the codeword structure includes the valid data, the check part, and a synchronization header.

The FEC code type may be an LDPC code or an RS code, and includes but is not limited to LDPC (18493, 15677), RS (2047, 1739), RS (1023, 847), RS (1023, 845), RS (1023, 843), RS (1023, 841), RS (1015, 839), RS (1017, 839), RS (1019, 839), or the like.

A FEC codeword value and a payload value are correspondingly set for each FEC code type. For example, for LDPC (18493, 15677) whose granularity is 1 bit, the FEC codeword value is 18493×1 bits, and the payload value is 15677×1 bits. For another example, for RS (1023, 847) whose granularity is 10 bits, the FEC codeword value is 1023×10 bits, and the payload value is 847×10 bits. Other FEC code types are similar thereto, and details are not described herein. Granularities of RS (1023, 845), RS (1023, 843), RS (1023, 841), RS (1015, 839), RS (1017, 839), and RS (1019, 839) are all 10 bits. A granularity of RS (2047, 1739) is 11 bits, indicating that the FEC codeword value is 2047×11=22517 bits, and the payload value is 1739×11=19129 bits.

It may be understood that another expression manner may alternatively be used for the FEC code type, for example, the FEC codeword value and the payload value may be indirectly indicated.

The FEC codeword value is equal to a sum of the payload value and a check length value. To be specific, check bits whose quantity is the check length value are generated after FEC encoding is performed on valid bits whose quantity is the payload value, and a sum of a length of the valid bits and a length of the check bits is equal to the FEC codeword value. For example, LDPC (18493, 15677) indicates that after FEC encoding is performed on 15677-bit data, 2816-bit check data is generated, and a total length of FEC-encoded data is 18493 bits. For another example, RS (1023, 847) indicates that after FEC encoding is performed on 8470-bit data, 1760-bit check data is generated, and a total length of FEC-encoded data is 10230 bits.

A length of the valid data is less than or equal to the payload value of a used FEC code type. The length of the valid data may be adjusted by adjusting N. N is an integer and may be equal to a quotient obtained by dividing the payload value by the length of the collected data block. N may also be less than the quotient obtained by dividing the payload value by the length of the collected data block. N may be equal to 1. In this case, the payload includes one data block. N may also be greater than or equal to 2.

In an implementation, the length of the valid data is equal to the payload value of the used FEC code type. In this case, the payload consists of the valid data. That is, a quotient obtained by dividing the payload value by the length of the collected data block is an integer, namely, the integer N. In this case, the valid data may also be referred to as the payload. LDPC (18493, 15677) is used as an example. If the collected data block is a 256 b/257 b data block, 156777/257=61, that is, N is 61, and a length of valid data constituted by 61 256 b/257 b data blocks is 15677. In this manner, all the payload is the valid data, and therefore encoding efficiency and bandwidth efficiency are high.

In another implementation, the length of the valid data is less than the payload value of the used FEC code type. The codeword structure further includes a padding part. In this case, the payload consists of the valid data and the padding part, and a sum of the length of the valid data and a length of the padding part is equal to the payload value. The length of the payload is equal to the payload value of the used FEC code type. That is, the length of the padding part may be equal to a difference between the payload value and the length of the valid data. The length of the padding part may alternatively be equal to a remainder obtained by dividing the payload value by the length of the collected data block. LDPC (18493, 15677) is used as an example. If the collected data block is a 128 b/129 b data block, a quotient obtained by dividing 15677 by 129 is 121, and a remainder is 68, that is, N is 121. A length of valid data constituted by 121 128 b/129 b data blocks is 15609, and 68 bits further need to be padded as the padding part such that the sum of the length of the valid data and the length of the padding part is equal to the payload value 15677. Step S203 includes that the physical coding sublayer of the source network device performs FEC encoding on the payload, to generate the check part. The source network device may perform FEC encoding on a 15677-bit field consisting of the valid data and the padding part as a whole, to generate the check part. In this manner, the padding field is added such that effective compatibility and adaption can be implemented between various FEC code types and line codes.

In this embodiment, the check part and the valid data each do not include the synchronization header. That is, the synchronization header is not included in the check part or the valid data. In this embodiment, the valid data, the check part, and the synchronization header are independently distributed in the codeword structure.

The synchronization header may be located at the head or the tail of the codeword structure, to further implement fast synchronization.

The synchronization header may alternatively be located between the valid data and the check part.

To ensure that an input rate and an output rate remain unchanged, a length of the synchronization header may be calculated in the following manner. If the length of the synchronization header is S, a length of the input data block is X, and a remainder obtained by dividing the FEC codeword value by X is Y, S=tX−Y, where t is an integer, and when Y≠0, t≥1, or when Y=0, t≥0.

Embodiment 1

The FEC code type is LDPC (18493, 15677), the input data block is a 64 b/66 b data block, the 64 b/66 b data block is transcoded into a 256 b/257 b data block, and the collected data block is a 256 b/257 b data block.

Figure 4A:
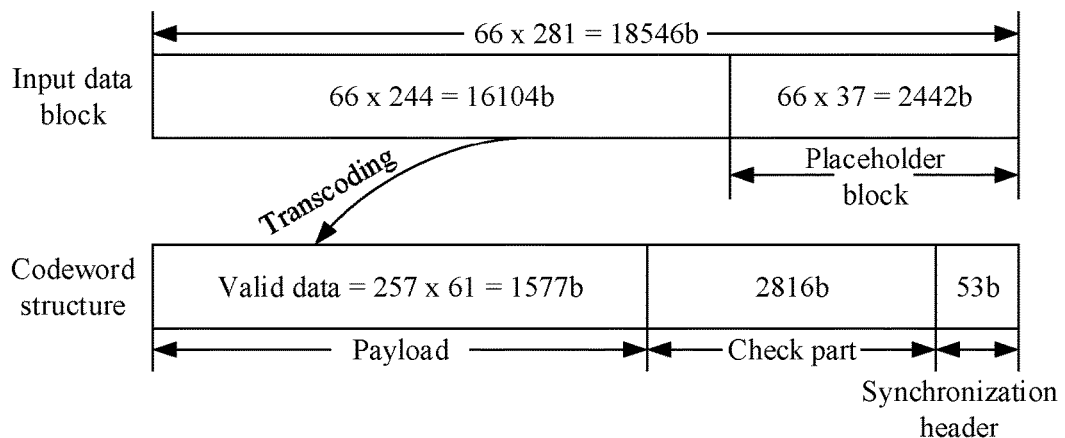
FIG. 4A is a schematic diagram of a combination of FEC coding and line coding according to an embodiment of the present disclosure.

As shown in FIG. 4A, 15677/257=61. Therefore, a padding part is not required in the codeword structure. N is 61, and the valid data is constituted by 61 256 b/257 b data blocks. The length of the valid data is 15677 bits, that is, the length of the payload is 15677 bits, which can meet a FEC requirement. The length of the check part is 2816 bits.

The 61 256 b/257 b data blocks may be generated by transcoding 61×4=244 64 b/66 b data blocks.

Because 18493/66=280.197, to ensure that the input rate and the output rate remain unchanged, a specific quantity of 66-bit placeholder blocks (that is, a size of each placeholder block is 66 bits) further need to be generated such that a sum of a quantity of placeholder blocks and a quantity of the input data blocks is at least 281. As shown in FIG. 4A, the quantity of 281 (that is, t=1) is used as an example in this embodiment. Therefore, 281−244=37 placeholder blocks are required. In this case, encoding efficiency can be maximized, and bandwidth efficiency can be improved.

281×66=18546, and 18546−18493=53. Therefore, the length of the synchronization header is 53 bits.

Likewise, when the quantity of placeholder blocks is 38, that is, t=2, the length of the synchronization header is 119 bits. The rest may be deduced by analogy.

Embodiment 2

The FEC code type is LDPC (18493, 15677), the input data block is a 64 b/66 b data block, the 64 b/66 b data block is transcoded into a 128 b/129 b data block, and the collected data block is a 128 b/129 b data block.

Figure 4B:
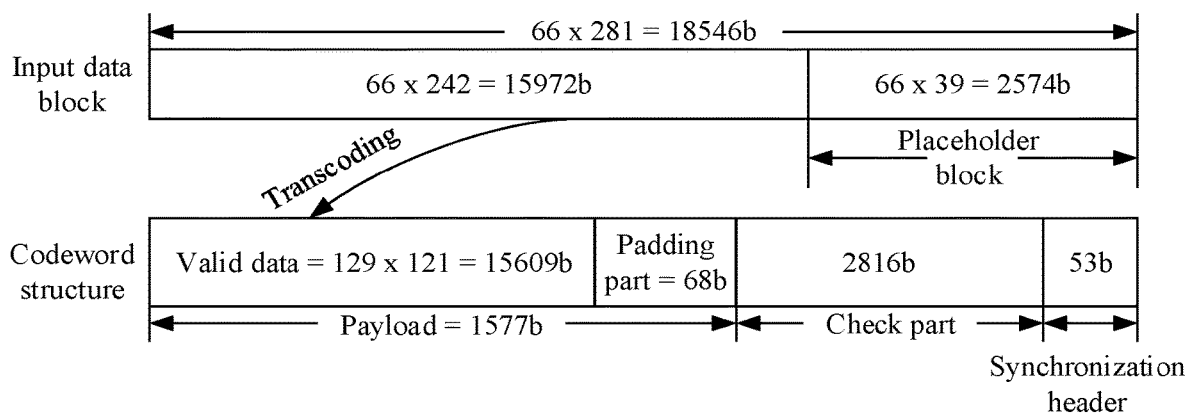
FIG. 4B is another schematic diagram of a combination of FEC coding and line coding according to an embodiment of the present disclosure.

As shown in FIG. 4B, a quotient obtained by dividing 15677 by 129 is 121, and a remainder is 68. Therefore, a padding part is required in the codeword structure, and a length of the padding part is 68 bits. N is 121, and the valid data is constituted by 121 128 b/129 b data blocks. The length of the valid data is 15609 bits. The sum of the length of the valid data and the length of the padding part is 15677 bits, that is, the length of the payload is 15677 bits, which can meet the FEC requirement. The length of the check part is 2816 bits.

The 121 128 b/129 b data blocks may be generated by transcoding 121×2=242 64 b/66 b data blocks.

Because 18493/66=280.197, to ensure that the input rate and the output rate remain unchanged, a specific quantity of 66-bit placeholder blocks (that is, a size of each placeholder block is 66 bits) further need to be generated such that a sum of a quantity of placeholder blocks and a quantity of the input data blocks is at least 281. As shown in FIG. 4B, the quantity of 281 (that is, t=1) is used as an example in this embodiment. Therefore, 281−242=39 placeholder blocks are required.

281×66=18546, and 18546−18493=53. Therefore, the length of the synchronization header is 53 bits.

Likewise, when the quantity of placeholder blocks is 40, that is, t=2, the length of the synchronization header is 119 bits. The rest may be deduced by analogy.

Embodiment 3

Figure 4C:
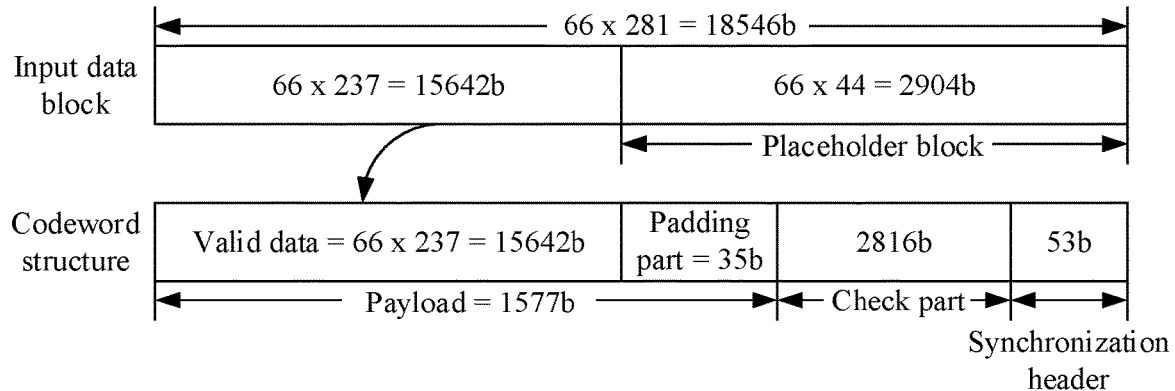
FIG. 4C is another schematic diagram of a combination of FEC coding and line coding according to an embodiment of the present disclosure.

The FEC code type is LDPC (18493, 15677), and the collected data block is a 64 b/66 b data block. A calculation process is the same as that in the foregoing example, and details are not described herein again. As shown in FIG. 4C, the valid data is constituted by 237 64 b/66 b data blocks, the length of the valid data is 15642 bits, the length of the padding part is 35 bits, the length of the check part is 2816 bits, and when t=1, the length of the synchronization header is 53 bits.

Embodiment 4

The FEC code type is RS (1023, 847), the input data block is a 64 b/66 b data block, the 64 b/66 b data block is transcoded into a 128 b/129 b data block, and the collected data block is a 128 b/129 b data block. The FEC codeword value is 10230, and the payload value is 8470.

Figure 4D:
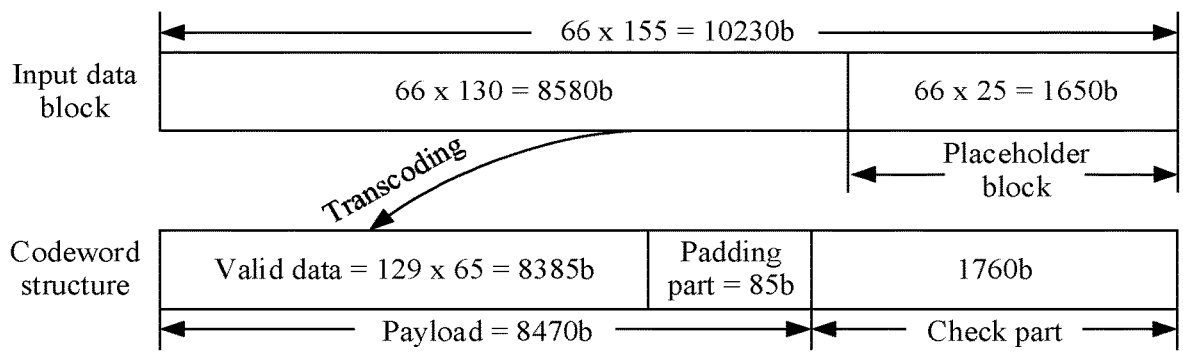
FIG. 4D is another schematic diagram of a combination of FEC coding and line coding according to an embodiment of the present disclosure.

As shown in FIG. 4D, a quotient obtained by dividing 8470 by 129 is 65, and a remainder is 85. Therefore, a padding part is required in the codeword structure, and a length of the padding part is 85 bits. N is 65, and the valid data is constituted by 65 128 b/129 b data blocks. The length of the valid data is 8385 bits. The sum of the length of the valid data and the length of the padding part is 8470 bits, that is, the length of the payload is 8470 bits, which can meet the FEC requirement. The length of the check part is 1760 bits.

The 65 128 b/129 b data blocks may be generated by transcoding 65×2=130 64 b/66 b data blocks.

Because 10230/66=155, and a remainder is 0, that is, Y=0, to ensure that the input rate and the output rate remain unchanged, a specific quantity of 66-bit placeholder blocks (that is, a size of each placeholder block is 66 bits) further need to be generated such that a sum of a quantity of placeholder blocks and a quantity of the input data blocks is at least 155. The quantity of 155 is used as an example (that is, t=0). Therefore, 155−130=25 placeholder blocks are required. In this case, no extra bit is used as the synchronization header, but the padding part may be directly used as the synchronization header. The entire padding part may be used as the synchronization header, for example, all 85 bits are used for synchronization. Alternatively, a part of the padding part may be used as the synchronization header. For example, 50 bits in the padding part are used for synchronization. Additional bits are not required, but instead the padding part is directly used as the synchronization header. This effectively reduces bits of invalid data and improves bandwidth efficiency and encoding efficiency.

It may be understood that the quantity of placeholder blocks may alternatively be 26, that is, t=1. In this case, the length of the synchronization header is 66 bits. The rest may be deduced by analogy.

Embodiment 5

The FEC code type is RS (1023, 847), the input data block is a 64 b/66 b data block, the 64 b/66 b data block is transcoded into a 256 b/257 b data block, and the collected data block is a 256 b/257 b data block. The FEC codeword value is 10230, and the payload value is 8470.

Figure 4E:
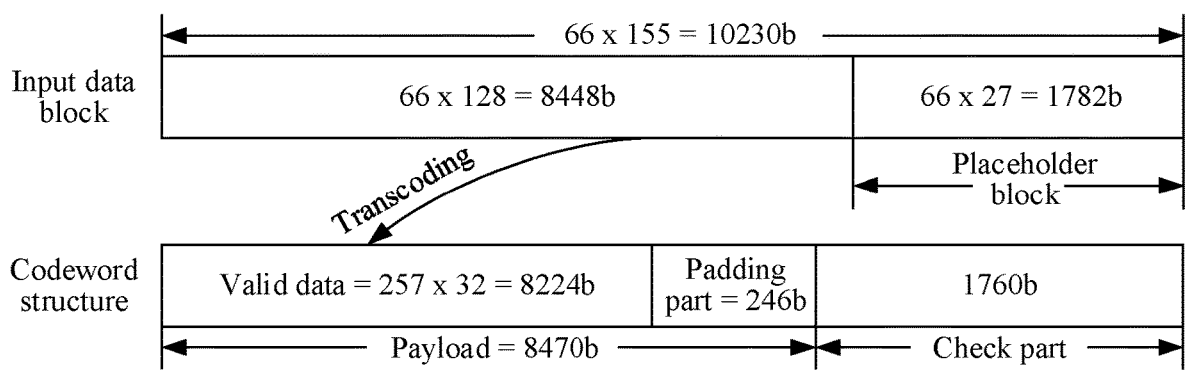
FIG. 4E is another schematic diagram of a combination of FEC coding and line coding according to an embodiment of the present disclosure.

A specific calculation process is the same as that described above, and details are not described herein again. For a specific principle, refer to FIG. 4E. The length of the valid data is 8224 bits, and the length of the padding part is 246 bits.

Embodiment 6

Figure 4F:
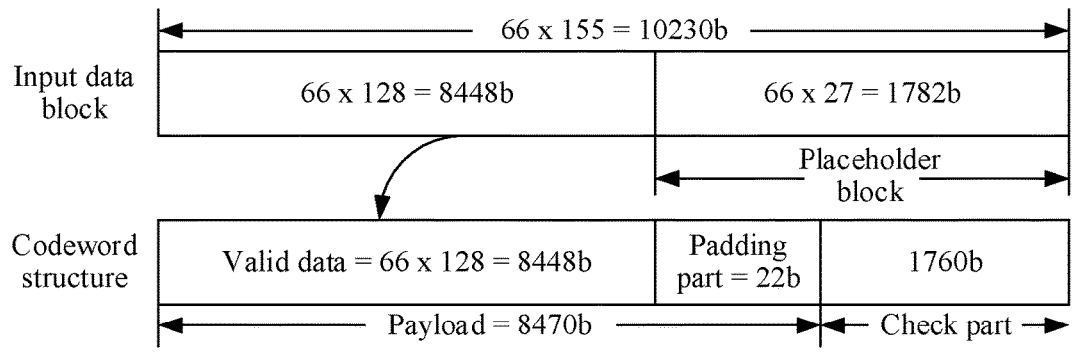
FIG. 4F is another schematic diagram of a combination of FEC coding and line coding according to an embodiment of the present disclosure.

The FEC code type is RS (1023, 847), and the collected data block is a 64 b/66 b data block. The FEC codeword value is 10230, and the payload value is 8470. A specific calculation process is the same as that described above, and details are not described herein again. For a specific principle, refer to FIG. 4F. The length of the valid data is 8448 bits, and the length of the padding part is 22 bits.

Embodiment 7

The FEC code type is RS (2047, 1739), the input data block is a 64 b/66 b data block, the 64 b/66 b data block is transcoded into a 256 b/257 b data block, and the collected data block is a 256 b/257 b data block. The FEC codeword value is 22517, and the payload value is 19129.

Figure 4G:
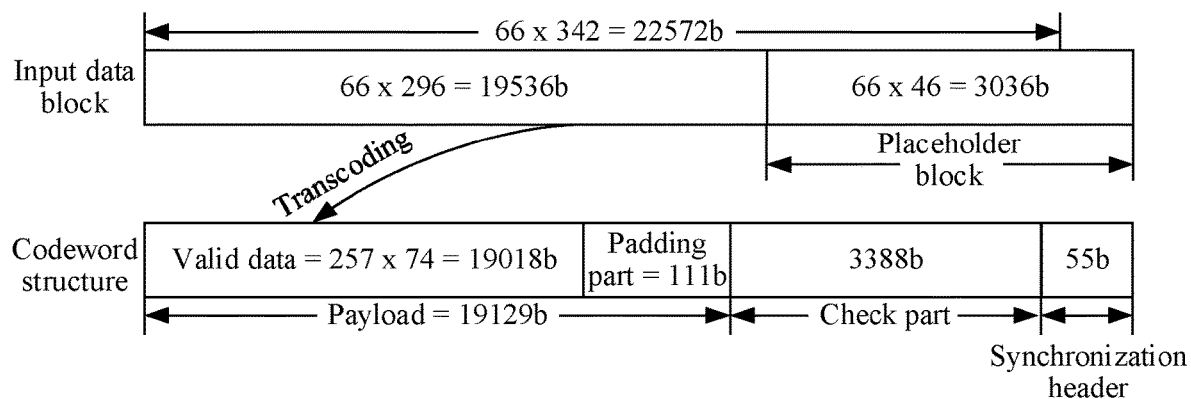
FIG. 4G is another schematic diagram of a combination of FEC coding and line coding according to an embodiment of the present disclosure.

A specific calculation process is the same as that described above, and details are not described herein again. For a specific principle, refer to FIG. 4G. The length of the valid data is 19018 bits, the length of the padding part is 111 bits, the length of the synchronization header is 55 bits, and the length of the check part is 3388 bits.

Embodiment 8

The FEC code type is RS (2047, 1739), the input data block is a 64 b/66 b data block, the 64 b/66 b data block is transcoded into a 128 b/129 b data block, and the collected data block is a 128 b/129 b data block. The FEC codeword value is 22517, and the payload value is 19129.

Figure 4H:
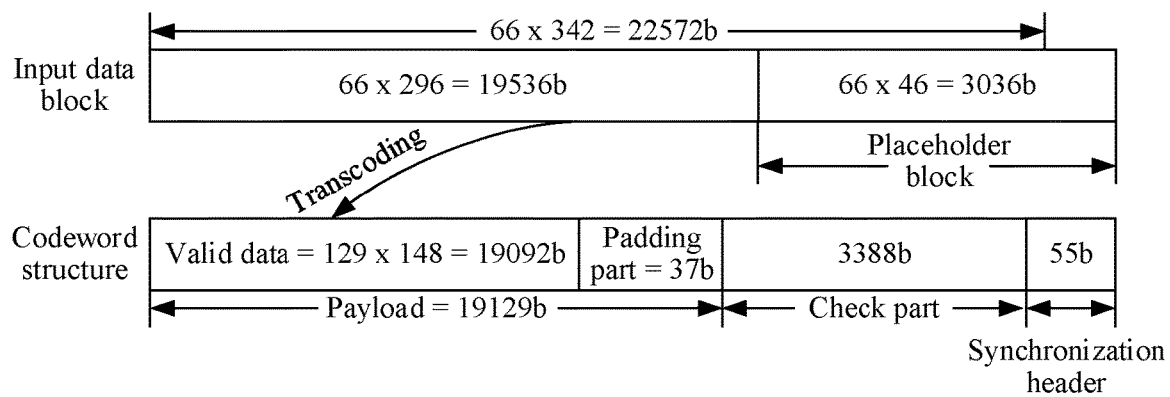
FIG. 4H is another schematic diagram of a combination of FEC coding and line coding according to an embodiment of the present disclosure.

A specific calculation process is the same as that described above, and details are not described herein again. For a specific principle, refer to FIG. 4H. The length of the valid data is 19092 bits, the length of the padding part is 37 bits, the length of the synchronization header is 55 bits, and the length of the check part is 3388 bits.

Embodiment 9

The FEC code type is RS (2047, 1739), the input data block is a 64 b/66 b data block, and the collected data block is a 64 b/66 b data block. The FEC codeword value is 22517, and the payload value is 19129.

Figure 4I:
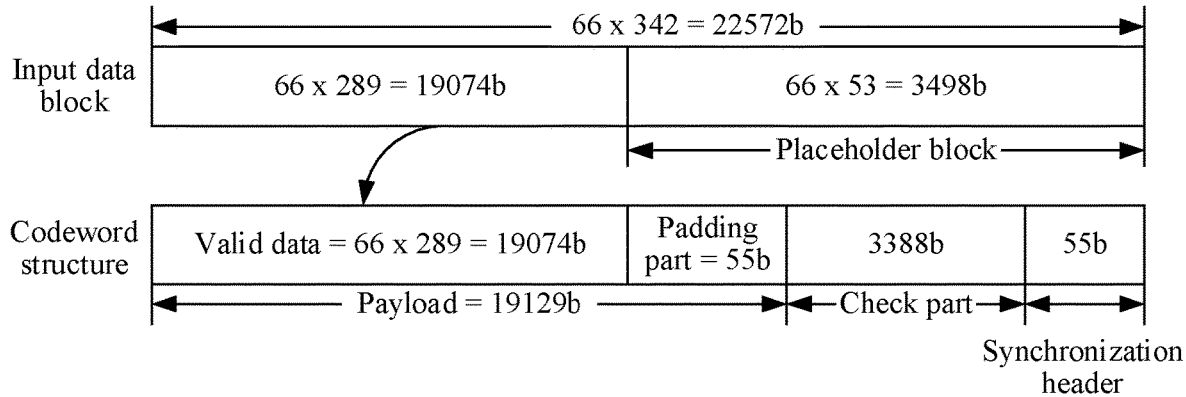
FIG. 4I is another schematic diagram of a combination of FEC coding and line coding according to an embodiment of the present disclosure.

A specific calculation process is the same as that described above, and details are not described herein again. For a specific principle, refer to FIG. 4I. The length of the valid data is 19074 bits, the length of the padding part is 55 bits, the length of the synchronization header is 55 bits, and the length of the check part is 3388 bits.

Embodiment 10

The FEC code type is LDPC (18493, 15677), the input data block is a 64 b/65 b data block, the 64 b/65 b data block is transcoded into a 256 b/257 b data block, and the collected data block is a 256 b/257 b data block. The FEC codeword value is 18493, and the payload value is 15677.

Figure 4J:
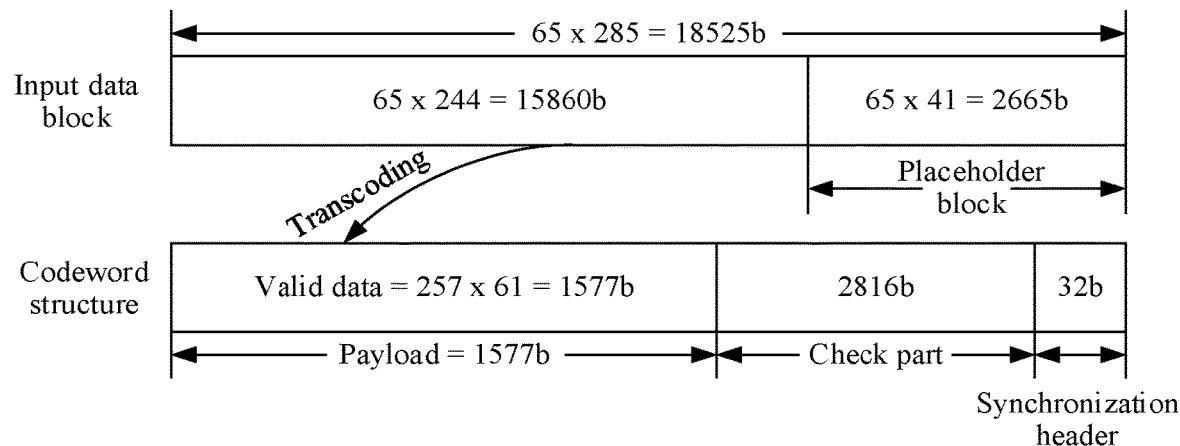
FIG. 4J is another schematic diagram of a combination of FEC coding and line coding according to an embodiment of the present disclosure.

A specific calculation process is the same as that described above, and details are not described herein again. For a specific principle, refer to FIG. 4J. The length of the valid data is 15677 bits, there is no padding part, the length of the synchronization header is 32 bits, and the length of the check part is 2816 bits.

Embodiment 11

The FEC code type is LDPC (18493, 15677), the input data block is a 64 b/65 b data block, the 64 b/65 b data block is transcoded into a 128 b/129 b data block, and the collected data block is a 128 b/129 b data block. The FEC codeword value is 18493, and the payload value is 15677.

Figure 4K:
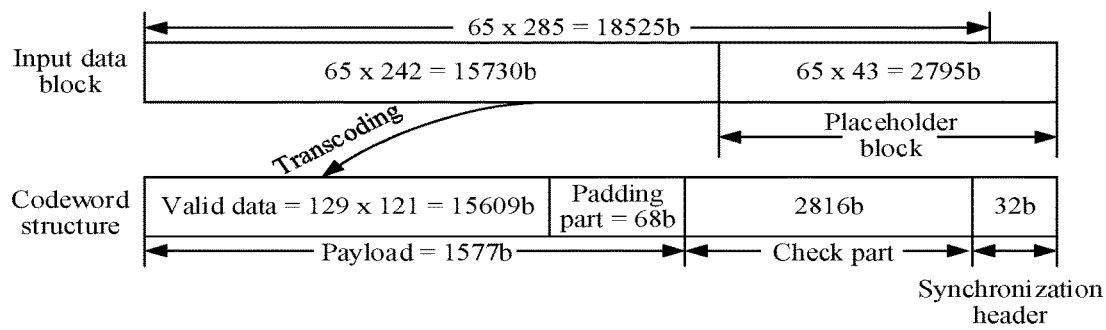
FIG. 4K is another schematic diagram of a combination of FEC coding and line coding according to an embodiment of the present disclosure.

A specific calculation process is the same as that described above, and details are not described herein again. For a specific principle, refer to FIG. 4K. The length of the valid data is 15609 bits, the length of the padding part is 68 bits, the length of the synchronization header is 32 bits, and the length of the check part is 2816 bits.

Embodiment 12

The FEC code type is LDPC (18493, 15677), the input data block is a 64 b/65 b data block, and the collected data block is a 64 b/65 b data block. The FEC codeword value is 18493, and the payload value is 15677.

Figure 4L:
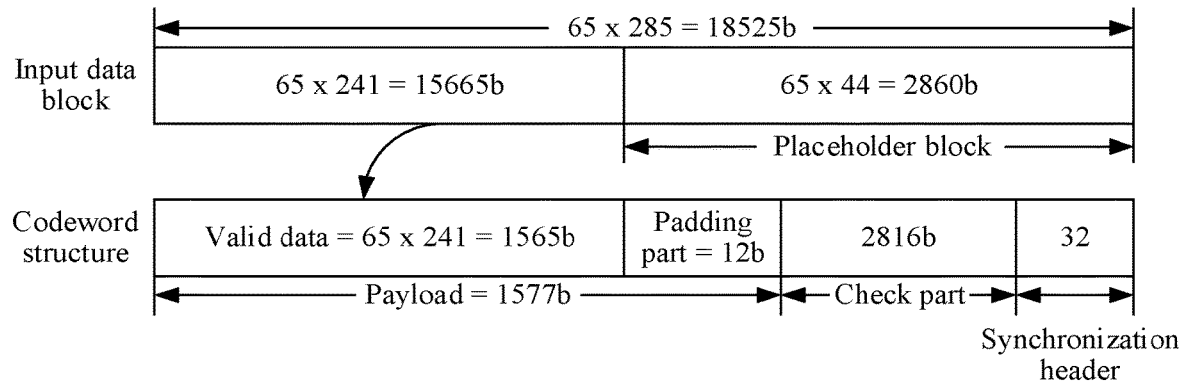
FIG. 4L is another schematic diagram of a combination of FEC coding and line coding according to an embodiment of the present disclosure.

A specific calculation process is the same as that described above, and details are not described herein again. For a specific principle, refer to FIG. 4L. The length of the valid data is 15665 bits, the length of the padding part is 12 bits, the length of the synchronization header is 32 bits, and the length of the check part is 2816 bits.

Embodiment 13

The FEC code type is RS (1023, 847), the input data block is a 64 b/65 b data block, the 64 b/65 b data block is transcoded into a 256 b/257 b data block, and the collected data block is a 256 b/257 b data block. The FEC codeword value is 10230, and the payload value is 8470.

Figure 4M:
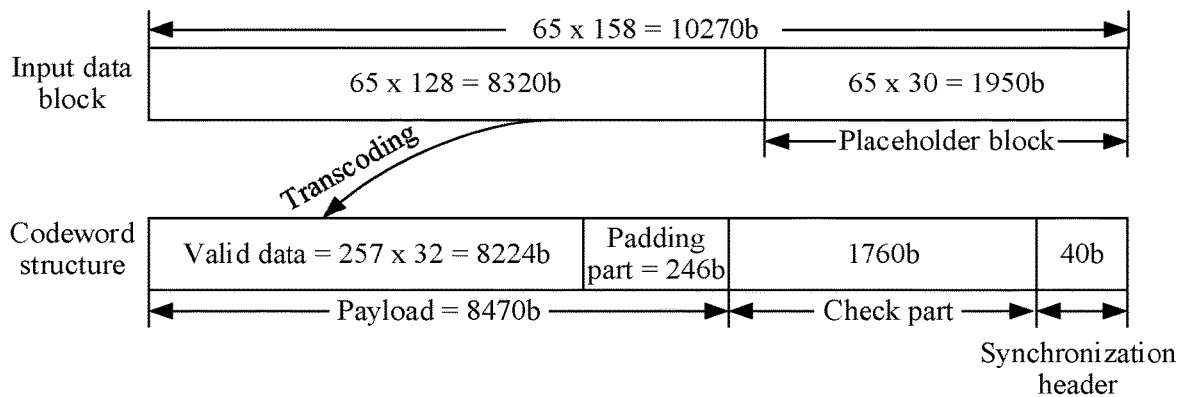
FIG. 4M is another schematic diagram of a combination of FEC coding and line coding according to an embodiment of the present disclosure.

A specific calculation process is the same as that described above, and details are not described herein again. For a specific principle, refer to FIG. 4M. The length of the valid data is 8224 bits, the length of the padding part is 246 bits, the length of the synchronization header is 40 bits, and the length of the check part is 1760 bits.

Embodiment 14

The FEC code type is RS (1023, 847), the input data block is a 64 b/65 b data block, the 64 b/65 b data block is transcoded into a 128 b/129 b data block, and the collected data block is a 128 b/129 b data block. The FEC codeword value is 10230, and the payload value is 8470.

Figure 4N:
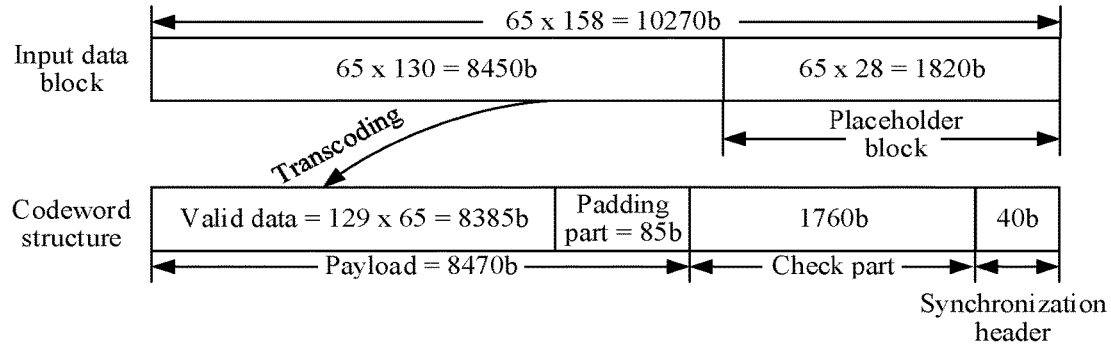
FIG. 4N is another schematic diagram of a combination of FEC coding and line coding according to an embodiment of the present disclosure.

A specific calculation process is the same as that described above, and details are not described herein again. For a specific principle, refer to FIG. 4N. The length of the valid data is 8385 bits, the length of the padding part is 85 bits, the length of the synchronization header is 40 bits, and the length of the check part is 1760 bits.

Embodiment 15

The FEC code type is RS (1023, 847), the input data block is a 64 b/65 b data block, and the collected data block is a 64 b/65 b data block. The FEC codeword value is 10230, and the payload value is 8470.

Figure 4O:
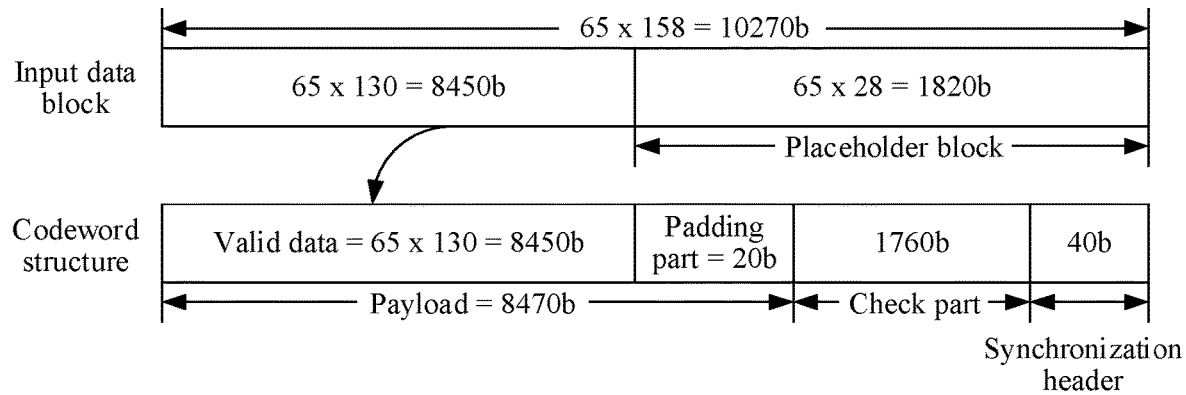
FIG. 4O is another schematic diagram of a combination of FEC coding and line coding according to an embodiment of the present disclosure.

A specific calculation process is the same as that described above, and details are not described herein again. For a specific principle, refer to FIG. 4O. The length of the valid data is 8450 bits, the length of the padding part is 20 bits, the length of the synchronization header is 40 bits, and the length of the check part is 1760 bits.

Embodiment 16

The FEC code type is RS (2047, 1739), the input data block is a 64 b/65 b data block, the 64 b/65 b data block is transcoded into a 256 b/257 b data block, and the collected data block is a 256 b/257 b data block. The FEC codeword value is 22517, and the payload value is 19129.

Figure 4P:
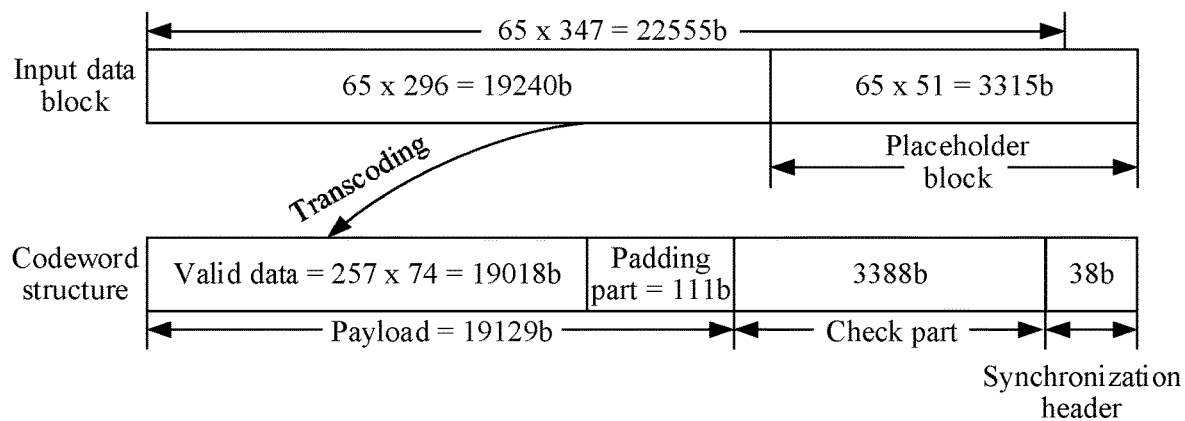
FIG. 4P is another schematic diagram of a combination of FEC coding and line coding according to an embodiment of the present disclosure.

A specific calculation process is the same as that described above, and details are not described herein again. For a specific principle, refer to FIG. 4P. The length of the valid data is 19018 bits, the length of the padding part is 111 bits, the length of the synchronization header is 38 bits, and the length of the check part is 3388 bits.

Embodiment 17

The FEC code type is RS (2047, 1739), the input data block is a 64 b/65 b data block, the 64 b/65 b data block is transcoded into a 128 b/129 b data block, and the collected data block is a 128 b/129 b data block. The FEC codeword value is 22517, and the payload value is 19129.

Figure 4Q:
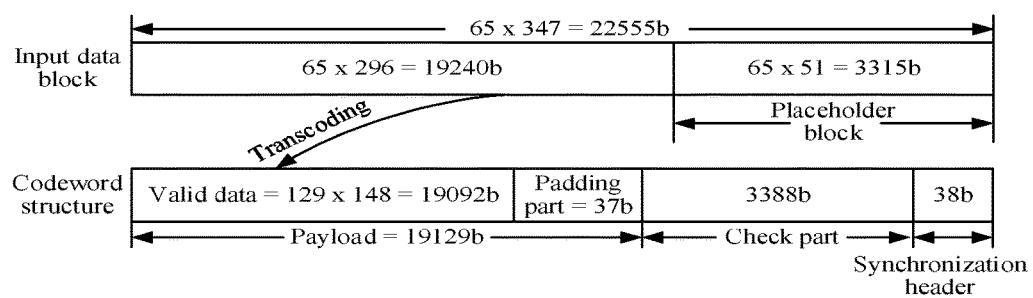
FIG. 4Q is another schematic diagram of a combination of FEC coding and line coding according to an embodiment of the present disclosure.

A specific calculation process is the same as that described above, and details are not described herein again. For a specific principle, refer to FIG. 4Q. The length of the valid data is 19092 bits, the length of the padding part is 37 bits, the length of the synchronization header is 38 bits, and the length of the check part is 3388 bits.

Embodiment 18

The FEC code type is RS (2047, 1739), the input data block is a 64 b/65 b data block, and the collected data block is a 64 b/65 b data block. The FEC codeword value is 22517, and the payload value is 19129.

Figure 4R:
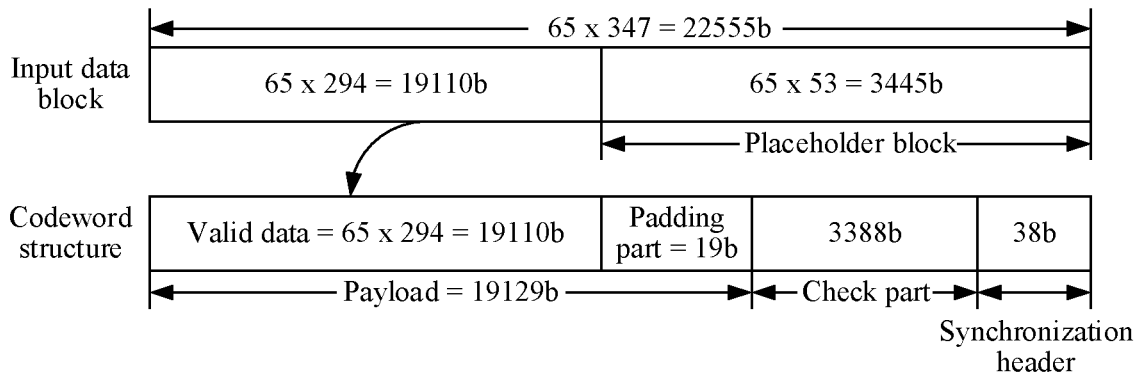
FIG. 4R is another schematic diagram of a combination of FEC coding and line coding according to an embodiment of the present disclosure.

A specific calculation process is the same as that described above, and details are not described herein again. For a specific principle, refer to FIG. 4R. The length of the valid data is 19110 bits, the length of the padding part is 19 bits, the length of the synchronization header is 38 bits, and the length of the check part is 3388 bits.

For other FEC code types such as RS (1023, 845), RS (1023, 843), RS (1023, 841), RS (1015, 839), RS (1017, 839), and RS (1019, 839), principles are the same as the principle described above, and details are not described.

It may be understood that another FEC code type may be used. For example, a FEC codeword value of the RS scheme is not limited to 10230, 20470, 10150, 10170, 10190, or the like, and may alternatively be 10210 or another value. A payload value of the RS scheme is not limited to 8390, 8310, 8330, 8350, 17390, or the like, and may alternatively be 8370, 17310, or another value. In addition, the foregoing FEC codeword values and the payload values may be freely combined to form an RS manner, provided that the foregoing calculation principle can be met.

In an embodiment, when extra bits are used as the synchronization header (for example, when a remainder obtained by dividing the FEC codeword value by the length of the input information block is not 0), the padding part may still be used as the synchronization header at the same time. To be specific, the entire padding part may be used as the synchronization header, or a part of the padding part may be used as the synchronization header. For example, when the length of the synchronization header is relatively short and cannot meet a synchronization requirement, the padding part may be used as the synchronization header at the same time. In this case, the entire padding part may be used as the synchronization header, or a part of the padding part may be used as the synchronization header.

In an embodiment, the padding part is further used to indicate a length of the codeword structure, the length of the valid data, a sum of the length of the valid data and the length the check part, the length of a payload, or a sum of the length of the payload and the length of the check part. Some or all bits in the padding part may be used for indication.

In another embodiment, the codeword structure further includes an indication part. The indication part is used to indicate the length of the codeword structure, the length of the valid data, the sum of the length of the valid data and the length of the check part, the length of the payload, or the sum of the length of the payload and the length of the check part. Some bits in the synchronization header may be used for indication.

For example, in an upstream direction, burst tail truncation may occur, causing that the length of the valid data is less than the payload value of FEC encoding, or the sum of the length of the valid data and the length of the padding part is less than the payload value of FEC encoding. For example, when LDPC (18493, 15677) is used, a length of valid data in the last codeword structure sent in the upstream may be less than 15677, or a sum of a length of the valid data and a length of a padding part in the last codeword structure sent in the upstream may be less than 15677. Therefore, the padding part or the indication part enables a target network device to learn of the length of the codeword structure, to implement correct parsing.

S206. A physical coding sublayer of the target network device receives the codeword structure.

S207. The physical coding sublayer of the target network device synchronizes the received codeword structure based on the synchronization header.

For example, the target network device may prestore synchronization sequences, and traverse the prestored synchronization sequences in the received codeword structure until the synchronization header in the codeword structure matches a prestored synchronization sequence, and then synchronization is completed.

S208. The physical coding sublayer of the target network device extracts the payload and the check part.

S209. The physical coding sublayer of the target network device performs FEC decoding on the payload using the extracted check part.

It may be understood that the FEC decoding herein corresponds to the foregoing FEC encoding, and may use a same scheme to express the FEC code type. For example, a FEC decoding scheme is LDPC (18493, 15677), RS (1023, 847), RS (1023, 845), RS (1023, 843), RS (1023, 841), RS (2047, 1739), RS (1015, 839), RS (1017, 839), or RS (1019, 839). LDPC (18493, 15677) is used as an example. The target network device performs FEC decoding on the 15677-bit valid data using the 2816-bit check data field.

It may be understood that, when the codeword structure includes the padding part, S210 includes that the target network device performs FEC decoding on the valid data and the padding part using the check part.

For specific details, refer to the foregoing description of the FEC encoding. Details are not described herein again.

According to the data encoding and decoding method provided in this embodiment of the present disclosure, a generated codeword structure includes valid data, a check part, and a synchronization header, and the valid data, the check part, and the synchronization header are independently distributed in the codeword structure such that fast synchronization can be implemented, and bandwidth efficiency and an error correction capability are improved.

The present disclosure further provides a precoding indication method. For specific details of a source network device and a target network device in this embodiment of the present disclosure, refer to the foregoing embodiment. Details are not described herein again. The source network device sends a codeword structure to the target network device. The source network device may or may not precode the codeword structure, and indicate, using indication information, whether the codeword structure is precoded. The target network device may determine, based on the indication information, whether the codeword structure is precoded, and further determine whether to de-precode the codeword structure. For specific details of the synchronization header in this embodiment, refer to the embodiment of the foregoing data encoding and decoding method. Details are not described herein again.

Figure 5:
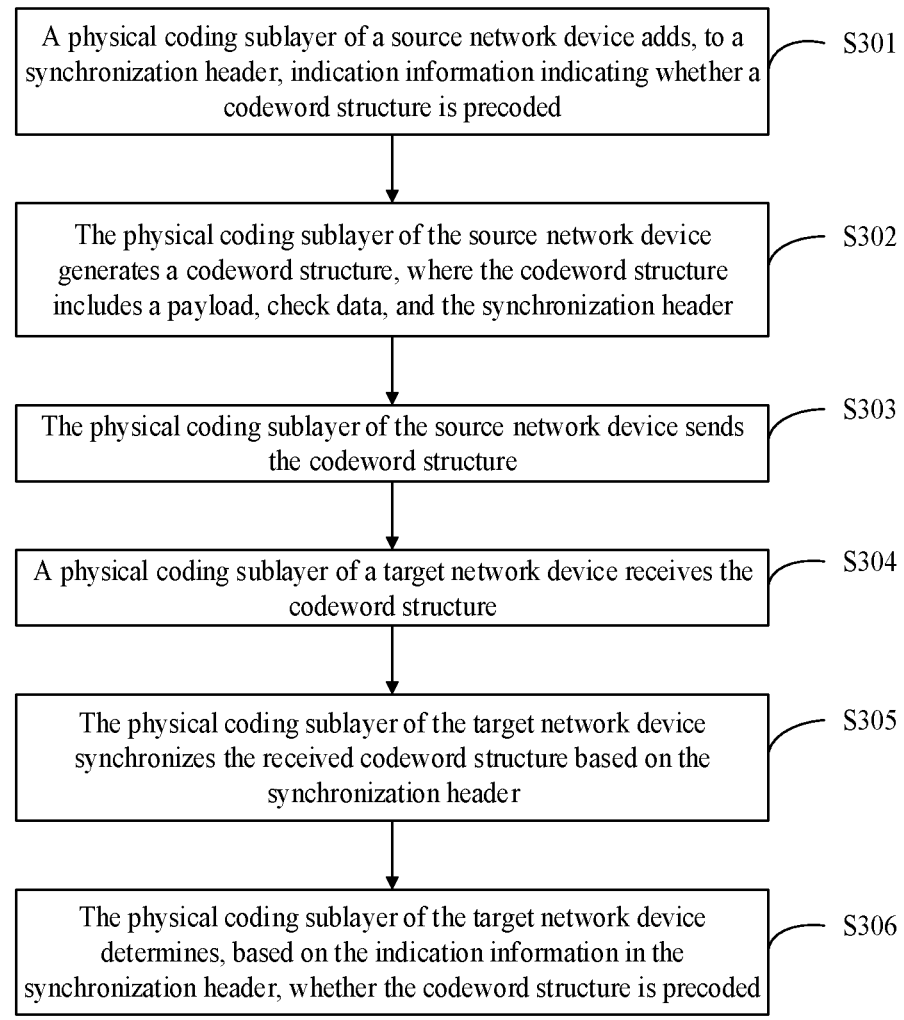
FIG. 5 is an example flowchart of a precoding indication method according to an embodiment of the present disclosure.

As shown in FIG. 5, the precoding indication method includes the following steps.

S301. A physical coding sublayer of the source network device adds, to the synchronization header, the indication information indicating whether the codeword structure is precoded.

For example, a bit at a preset location in the synchronization header may be used as the indication information. The specific location may be agreed upon by the source network device and the target network device. For example, if the last bit in the synchronization header is "0", it indicates that the codeword structure is precoded, if the last bit in the synchronization header is "1", it indicates that the codeword structure is not precoded.

Further, precoding may be performed in an exclusive OR manner.

In an embodiment, an exclusive OR operation may be performed on a preset initial bit and the first bit in an original codeword structure, and an obtained bit is used as the first bit in an output codeword structure. An exclusive OR operation is performed on the second bit in the original codeword structure and the first bit in the output codeword structure, and an obtained bit is used as the second bit in the output codeword structure. An exclusive OR operation is performed on the third bit in the original codeword structure and the second bit in the output codeword structure, and an obtained bit is used as the third bit in the output codeword structure, and so on, until an exclusive OR operation is performed on the last bit in the original codeword structure and a penultimate bit in the output codeword structure, and an obtained bit is used as the last bit in the output codeword structure.

The preset initial bit may be "0" or "1".

For example, it is assumed that an original sequence in the original codeword structure is "0110101110". When the preset initial bit is "0", an output sequence is "0100110100", or when the preset initial bit is "1", an output sequence is "1011001011".

In another embodiment, an exclusive OR operation may alternatively be performed on a preset initial bit and each bit in the original codeword structure. To be specific, an exclusive OR operation is performed on the initial bit and the first bit in the original codeword structure to obtain the first bit in the output codeword structure, and an exclusive OR operation is performed on the initial bit and the second bit in the original codeword structure to obtain the second bit in the output codeword structure, and so on.

S302. The physical coding sublayer of the source network device generates the codeword structure, where the codeword structure includes a payload, check data, and the synchronization header. For specific details of the codeword structure, refer to the foregoing embodiment. Details are not described herein again. A difference between the codeword structure and that in the foregoing embodiment lies in that the indication information indicating whether the codeword structure is precoded is added to the synchronization header.

S303. The physical coding sublayer of the source network device sends the codeword structure.

The physical coding sublayer may send the codeword structure to a physical medium attachment (PMA) sublayer of the source network device for subsequent processing.

S304. A physical coding sublayer of the target network device receives the codeword structure. The physical coding sublayer of the target network device may receive the codeword structure sent by the PMA sublayer of the target network device.

S305. The physical coding sublayer of the target network device synchronizes the received codeword structure based on the synchronization header.

In an embodiment, the source network device and the target network device may pre-agree upon whether to perform precoding, or may pre-agree an initial bit for precoding. In this way, after receiving the codeword structure, the target network device may determine, based on a previous agreement, whether to perform de-precoding, and determine the initial bit used for de-precoding. Further, when the source network device and the target network device pre-agree upon that precoding is not performed, the target network device may directly synchronize on the codeword structure based on the prestored synchronization sequence. When the source network device and the target network device pre-agree upon that precoding is performed, the target network device may first perform de-precoding on the codeword structure, and then synchronize the codeword structure based on the prestored synchronization sequence. Alternatively, synchronization may be performed before de-precoding.

In another embodiment, the source network device and the target network device may not pre-agree upon whether to perform precoding. The target network device may determine, through blind detection, whether the received codeword structure is precoded.

Further, the target network device may prestore a first synchronization sequence and a second synchronization sequence. The first synchronization sequence may be an original synchronization sequence for the codeword structure before precoding, and the second synchronization sequence may be an output synchronization sequence for the codeword structure after precoding. It may be understood that there may be two types of second synchronization sequences: a synchronization sequence that is output after precoding is performed using the original bit "0", and a synchronization sequence that is output after precoding is performed using the original bit "1".

If the synchronization header matches the first synchronization sequence, it is determined that the codeword structure is not precoded. In this case, the target network device directly extracts valid data and a check part from the codeword structure.

If the synchronization header matches the second synchronization sequence, it is determined that the codeword structure is precoded. The target network device de-precodes the codeword structure, and the target network device extracts valid data and a check part from a de-precoded codeword structure.

S306. The physical coding sublayer of the target network device determines, based on the indication information in the synchronization header, whether the codeword structure is precoded.

In this embodiment, the indication information indicating whether the codeword structure is precoded is added to the synchronization header such that the target network device can further determine, based on the information, whether a previous blind detection result is correct, to make a double check.

Figure 6:
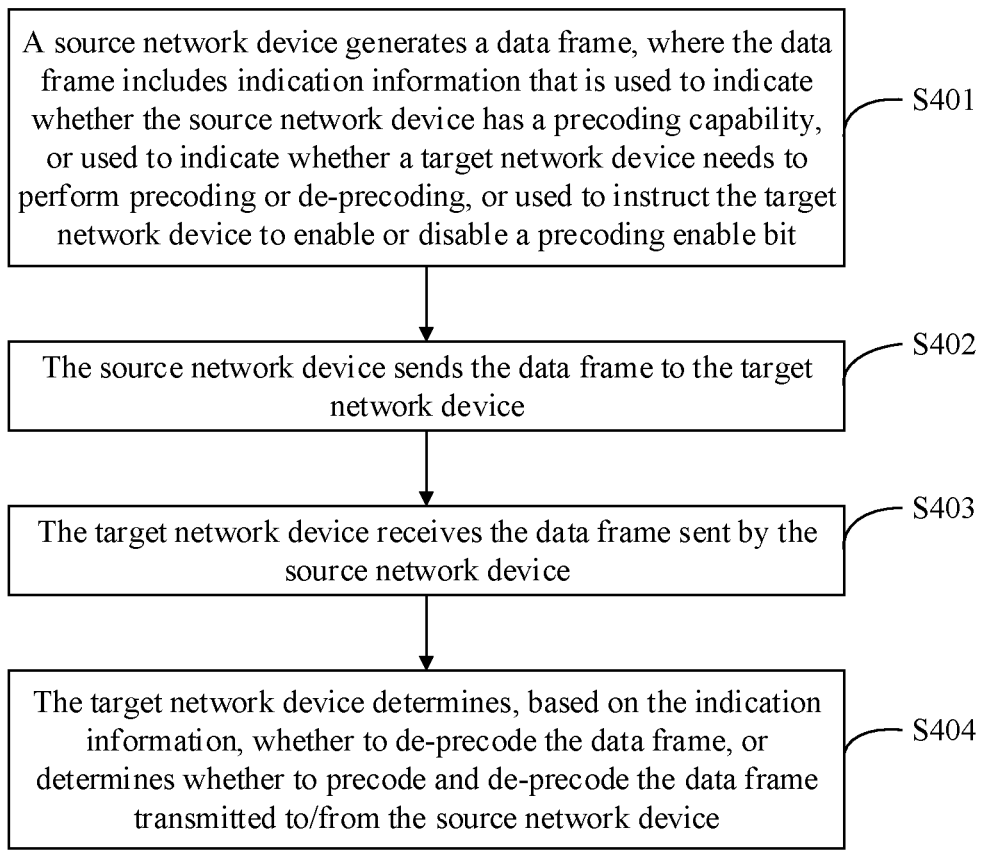
FIG. 6 is an example flowchart of a precoding indication method according to another embodiment of the present disclosure.

The present disclosure further provides a precoding indication method. For specific details of a source network device and a target network device in this embodiment of the present disclosure, refer to the foregoing embodiment. Details are not described herein again. The source network device sends a data frame to the target network device. The source network device may or may not precode the data frame, and may indicate, using indication information, whether the data frame is precoded. The target network device may determine, based on the indication information, whether the data frame is precoded, and further determine whether to de-precode the data frame. The method may be performed by a MAC control sublayer, or may be performed by a processor. As shown in FIG. 6, the method includes the following steps.

S401. The source network device generates the data frame, where the data frame includes indication information that is used to indicate whether the source network device has a precoding capability, or used to indicate whether the target network device needs to perform precoding or de-precoding, or used to indicate the target network device to enable or disable a precoding enable bit.

S402. The source network device sends the data frame to the target network device.

S403. The target network device receives the data frame sent by the source network device.

S404. The target network device determines, based on the indication information, whether to de-precode the data frame, or determines whether to precode and de-precode the data frame transmitted to/from the source network device.

It may be understood that the target network device also needs to synchronize the data frame. For details of a specific synchronization method, refer to the foregoing embodiment. Details are not described herein again.

In an embodiment, the source network device is an ONU, and the target network device is an OLT. The data frame carries a registration request message (i.e., REGISTER_REQ), and the registration request message includes indication information used to indicate whether the ONU has a precoding capability. That is, the ONU reports, to the OLT, whether the ONU has a precoding capability. The OLT may determine, based on the indication information, whether to precode data to be sent to the ONU. The indication information indicating whether the source network device has a precoding capability is added to the data frame, to notify the target network device whether the data frame sent by the source network device needs to be de-precoded, and whether the data frame to be sent to the source network device needs to be precoded.

In another embodiment, the source network device is an OLT, and the target network device is an ONU. The data frame carries a discovery gate (i.e., Discovery Gate) message, and the discovery gate message includes indication information used to indicate whether the ONU needs to perform precoding or de-precoding. Further, the OLT may indicate whether a message sent to the ONU in the downstream is precoded, that is, indicate whether the ONU needs to de-precode the data received in the downstream, and may further indicate whether upstream data to be sent by the ONU to the OLT in the upstream needs to be precoded. The data frame may include an upstream indication part and a downstream indication part. The upstream indication part is used to indicate whether precoding is performed during upstream sending, and the downstream indication part is used to indicate whether precoding is performed during downstream sending. The upstream indication part and the downstream indication part may be located at preset locations, and are pre-agreed upon by the OLT and the ONU. Alternatively, an upstream identifier and a downstream identifier may be added to indicate whether an indication part is the upstream indication part or the downstream indication part. In this embodiment, the indication information indicating whether the data frame is precoded is added to the data frame such that the target network device can further determine, based on the information, whether a previous blind detection result is correct, to make a double check. In addition, whether precoding is required in the upstream or the downstream is indicated such that the source network device and the target network device may perform precoding and de-precoding based on the indication. This avoids an error and improves efficiency.

In another embodiment, the source network device is an OLT, and the target network device is an ONU. The data frame carries a registration (i.e., Register) message, and the message includes the indication information used to indicate the ONU to enable or disable the precoding enable bit. After receiving the indication information, the ONU enables or disables the precoding enable bit. For example, when the precoding enable bit is enabled, the ONU performs precoding or de-precoding. When the precoding enable bit is disabled, the ONU does not perform precoding or de-precoding. Alternatively, when the precoding enable bit is enabled, the ONU does not perform precoding or de-precoding, when the precoding enable bit is disabled, the ONU performs precoding or de-precoding. The precoding enable bit may be a bit at the preset location, for example, may be one bit or two bits, or may be another quantity of bits. Using one bit as an example, when the bit is "0", it indicates that the precoding enable bit is disabled, when the bit is "1", it indicates that the precoding enable bit is enabled. The ONU may feed back enable response indication information to the OLT by adding the enable response indication information to a registration response message (i.e., Register_ACK), to notify the OLT whether the ONU enables the precoding enable bit.

The present disclosure further provides a network device. The network device may be an OLT 110, or may be an ONU 130.

Figure 7:
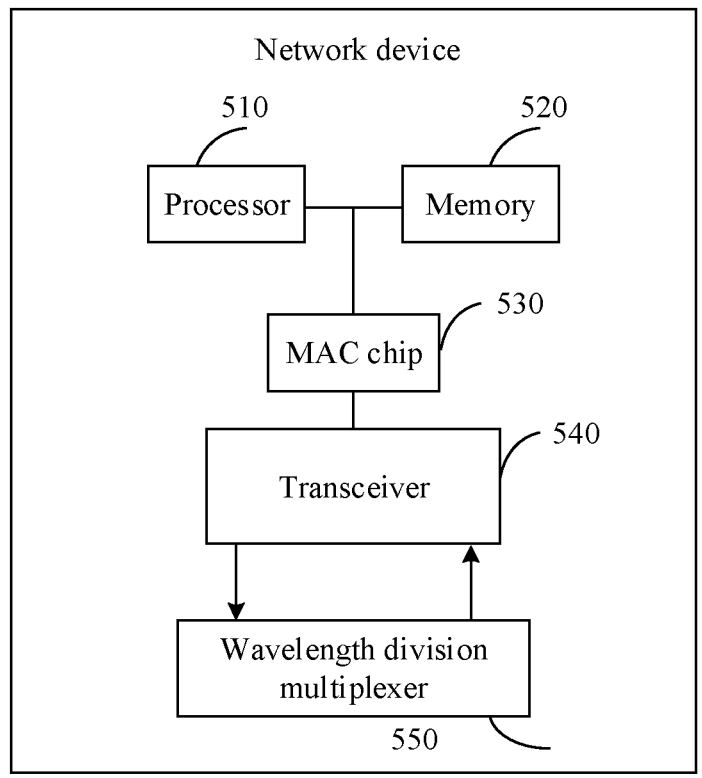
FIG. 7 is a schematic diagram of a hardware structure of a network device according to an embodiment of the present disclosure.

As shown in FIG. 7, the network device includes a processor 510, a memory 520, a MAC chip 530, a transceiver 540, and a wavelength division multiplexer 550.

The processor 510 may execute a related program using a general-purpose central processing unit (CPU), a microprocessor, an application-specific integrated circuit (ASIC), or at least one integrated circuit, to implement the technical solutions provided in this embodiment of the present disclosure.

The memory 520 may be a read-only memory (ROM), a static storage device, a dynamic storage device, or a random-access memory (RAM). The memory 520 may store an operating system and another application program. When the technical solutions provided in this embodiment of the present disclosure are implemented using software or firmware, program code for implementing the technical solutions provided in this embodiment of the present disclosure is stored in the memory 520, and is executed by the processor 510.

In an embodiment, the processor 510 may include the memory 520. In another embodiment, the processor 510 and the memory 520 are two independent structures.

In one embodiment, the processor 510 and the MAC chip 530 may be two independent structures. In another embodiment, the processor 510 may include the MAC chip 530. The MAC chip 530 may include a physical coding sublayer and a MAC control sublayer.

The transceiver 540 may include an optical transmitter and/or an optical receiver. The optical transmitter may be configured to send an optical signal, and the optical receiver may be configured to receive an optical signal. The optical transmitter may be implemented using a light emitting device, for example, a gas laser, a solid-state laser, a liquid laser, a semiconductor laser, or a direct modulated laser. The optical receiver may be implemented using an optical detector, for example, a photodetector or a photodiode (for example, an avalanche diode). The transceiver 540 may further include a digital-to-analog converter and an analog-to-digital converter.

The wavelength division multiplexer 550 is connected to the transceiver 540. When the network device sends an optical signal, the wavelength division multiplexer serves as a multiplexer. When the network device receives an optical signal, the wavelength division multiplexer serves as a demultiplexer. The wavelength division multiplexer may also be referred to as an optical coupler.

When the network device is used as the foregoing source network device, it can be learned from the foregoing embodiment that the physical coding sublayer of the source network device is configured to perform steps S200, S201, S202, S203, S204, and S205. The physical coding sublayer of the source network device is configured to perform steps S301, S302, and S303. The MAC control sublayer or the processor of the source network device is configured to perform step S401, and the transceiver is configured to perform step S402.

When the network device is used as the foregoing target network device, it can be learned from the foregoing embodiment that the physical coding sublayer of the target network device is configured to perform steps S206, S207, S208, and S209, and the physical coding sublayer of the target network device is further configured to perform steps S304, S305, and S306. The MAC control sublayer or the processor 510 of the target network device is configured to perform step S404, and the transceiver 540 is configured to perform step S403.

For more details of performing the foregoing steps by the processor 510, the transceiver 540, the MAC control sublayer, and the physical coding sublayer, refer to related descriptions of the foregoing method embodiments and the accompanying drawings. Details are not described herein again.

This embodiment of the present disclosure also has various beneficial effects described in the foregoing method embodiments. Details are not described herein again.

Figure 8:
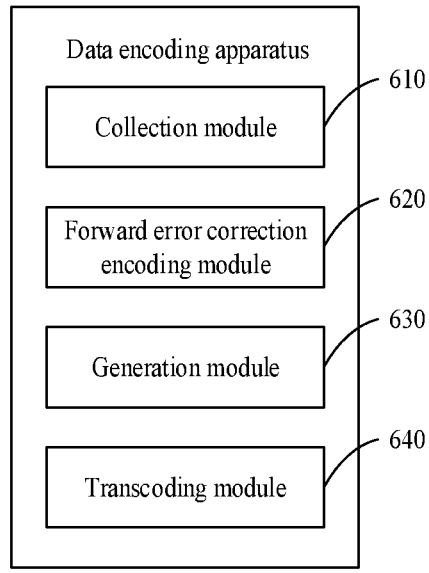
FIG. 8 is a schematic diagram of example function modules of a data encoding apparatus according to an embodiment of the present disclosure.

The present disclosure further provides a data encoding apparatus in a PON system. The apparatus may be integrated into the source network device in the foregoing embodiment, for example, may be integrated into a MAC chip of the source network device. As shown in FIG. 8, the apparatus includes a collection module 610, a FEC encoding module 620, and a generation module 630.

It can be learned from the foregoing embodiment that the collection module 610 is configured to perform steps S200 and S202, the FEC encoding module 620 is configured to perform step S204, and the generation module 630 is configured to perform steps S203 and S205.

The apparatus further includes a transcoding module 640, where the transcoding module is configured to perform step S201.

For more details of performing the foregoing steps by the modules in the apparatus, refer to related descriptions of the foregoing method embodiments and the accompanying drawings. Details are not described herein again.

This embodiment of the present disclosure also has various beneficial effects described in the foregoing method embodiments. Details are not described herein again.

Figure 9:
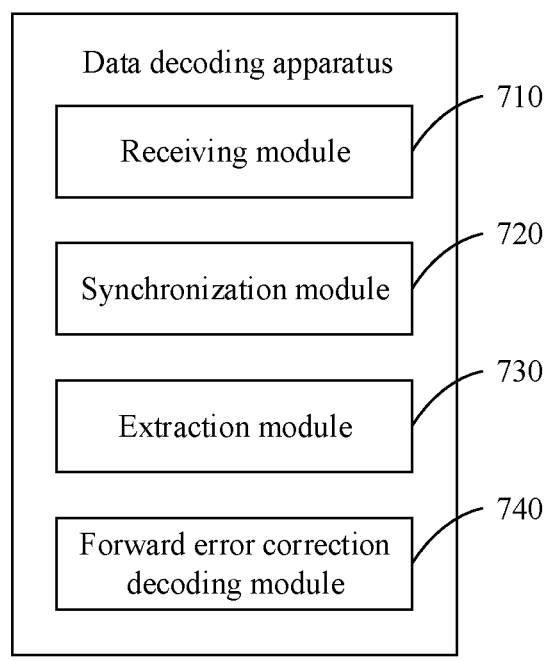
FIG. 9 is another schematic diagram of example function modules of a data decoding apparatus according to an embodiment of the present disclosure.

The present disclosure further provides a data decoding apparatus in a PON system. The apparatus may be integrated into the target network device in the foregoing embodiment, for example, may be integrated into a MAC chip of the target network device. As shown in FIG. 9, the apparatus includes a receiving module 710, a synchronization module 720, an extraction module 730, and a FEC decoding module 740.

It can be learned from the foregoing embodiment that the receiving module 710 is configured to perform step S206, the synchronization module 720 is configured to perform step S207, the extraction module 730 is configured to perform step S208, and the FEC decoding module 740 is configured to perform step S209.

For more details of performing the foregoing steps by the modules in the apparatus, refer to related descriptions of the foregoing method embodiments and the accompanying drawings. Details are not described herein again.

This embodiment of the present disclosure also has various beneficial effects described in the foregoing method embodiments. Details are not described herein again.

The present disclosure further provides a precoding indication apparatus in a PON system. The apparatus may be integrated into the source network device in the foregoing embodiment, for example, may be integrated into a MAC chip of the source network device. The apparatus includes an adding module, a generation module, and a sending module.

It can be learned from the foregoing embodiment that the adding module is configured to perform step S301, the generation module is configured to perform step S302, and the sending module is configured to perform step S303.

For more details of performing the foregoing steps by the modules in the apparatus, refer to related descriptions of the foregoing method embodiments and the accompanying drawings. Details are not described herein again.

This embodiment of the present disclosure also has various beneficial effects described in the foregoing method embodiments. Details are not described herein again.

The present disclosure further provides a precoding indication apparatus in a PON system. The apparatus may be integrated into the target network device in the foregoing embodiment, for example, may be integrated into a MAC chip of the target network device. The apparatus includes a receiving module, a synchronization module, and a determining module.

It can be learned from the foregoing embodiment that the receiving module is configured to perform step S304, the synchronization module is configured to perform step S305, and the determining module is configured to perform step S306.

For more details of performing the foregoing steps by the modules in the apparatus, refer to related descriptions of the foregoing method embodiments and the accompanying drawings. Details are not described herein again.

This embodiment of the present disclosure also has various beneficial effects described in the foregoing method embodiments. Details are not described herein again.

The present disclosure further provides a precoding indication apparatus in a PON system. The apparatus may be integrated into the source network device in the foregoing embodiment, for example, may be integrated into a MAC chip or a processor of the source network device. The apparatus includes a generation module and a sending module.

It can be learned from the foregoing embodiment that the generation module is configured to perform step S401, and the sending module is configured to perform step S402.

For more details of performing the foregoing steps by the modules in the apparatus, refer to related descriptions of the foregoing method embodiments and the accompanying drawings. Details are not described herein again.

This embodiment of the present disclosure also has various beneficial effects described in the foregoing method embodiments. Details are not described herein again.

The present disclosure further provides a precoding indication apparatus in a PON system. The apparatus may be integrated into the target network device in the foregoing embodiment, for example, may be integrated into a MAC chip or a processor of the target network device. The apparatus includes a receiving module and a determining module.

It can be learned from the foregoing embodiment that the receiving module is configured to perform step S403, and the determining module is configured to perform step S404.

For more details of performing the foregoing steps by the modules in the apparatus, refer to related descriptions of the foregoing method embodiments and the accompanying drawings. Details are not described herein again.

This embodiment of the present disclosure also has various beneficial effects described in the foregoing method embodiments. Details are not described herein again.

The present disclosure further provides an OLT. The OLT includes the data encoding apparatus according to any one of the foregoing embodiments, or the OLT includes the data decoding apparatus according to any one of the foregoing embodiments, or the OLT includes the precoding indication apparatus according to any one of the foregoing embodiments.

The present disclosure further provides an ONU. The ONU includes the data encoding apparatus according to any one of the foregoing embodiments, or the ONU includes the data decoding apparatus according to any one of the foregoing embodiments, or the ONU includes the precoding indication apparatus according to any one of the foregoing embodiments.

The present disclosure further provides a PON system, where the system includes the foregoing OLT and the foregoing ONU.

All or some of the foregoing embodiments may be implemented using software, hardware, firmware, or any combination thereof. When software is used to implement the embodiments, the embodiments may be implemented completely or partially in a form of a computer program product. The computer program product includes one or more computer instructions. When the computer program instructions are loaded and executed on a computer, the procedure or functions according to the embodiments of the present disclosure are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a FLOPPY DISK, a hard disk, or a magnetic tape), an optical medium (for example, a digital versatile disc (DVD)), a semiconductor medium (for example, a solid-state drive (SSD)), or the like.

To sum up, the foregoing descriptions are merely embodiments of the present disclosure, but are not intended to limit the protection scope of the present disclosure. Any modification, equivalent replacement, improvement, or the like made without departing from the spirit and principle of the present disclosure shall fall within the protection scope of the present disclosure.

What is claimed is:

1. A data encoding method in a passive optical network (PON) system comprising:
   collecting N data blocks at a physical coding sublayer, wherein N is an integer less than or equal to a ratio of a payload length value corresponding to a forward error correction (FEC) code type to a length of each of the N data blocks;

combining the N data blocks to generate valid data;

generating a payload at the physical coding sublayer, wherein the payload comprises the valid data, and wherein a length of the payload is equal to the payload length value;

performing, at the physical coding sublayer and based on the FEC code type, FEC encoding on the payload to generate a check part, wherein a length of the check part is equal to a difference between an FEC codeword length value corresponding to the FEC code type and the payload length value; and generating a codeword structure at the physical coding sublayer, wherein the codeword structure comprises the valid data, the check part, and a synchronization header, and wherein the synchronization header is located at a head of the codeword structure, at a tail of the codeword structure, or between the valid data and the check part.

2. The data encoding method of claim 1, wherein each of the N data blocks is a 128 bit (b)/129b data block or a 256b/257b data block, and wherein the data encoding method further comprises transcoding an input data block of 64b/66b or 64b/65b into the 128b/129b or 256b/257b data block at the physical coding sublayer.

3. The data encoding method of claim 1, further comprising identifying that the payload comprises the valid data when a length of the valid data is equal to the payload length value.

4. The data encoding method of claim 1, further comprising identifying that the codeword structure further comprises a padding part, the payload comprises the valid data and the padding part, and a sum of a length of the valid data and a length of the padding part is equal to the payload length value when the length of the valid data is less than the payload length value.

5. The data encoding method of claim 2, wherein a length of the synchronization header is S, wherein a length of the input data block is X, and a remainder obtained by dividing the FEC codeword length value by X is Y, S=tX−Y, wherein t is an integer, wherein t≥1 when Y≠0, and wherein t≥0 when Y=0.

6. The data encoding method of claim 1, wherein a collected data block is a 64b/66b or 64b/65b input data block.

7. The data encoding method of claim 6, wherein a length of the synchronization header is S, wherein a length of the input data block is X, wherein a remainder Y is obtained by dividing the FEC codeword length value by X, wherein S=tX−Y, wherein t is an integer, wherein t≥1 when Y≠0, and wherein t≥0 when Y=0.

8. A data decoding method in a passive optical network (PON) system comprising:

receiving a codeword structure at a physical coding sublayer, wherein the codeword structure comprises valid data, a check part, and a synchronization header, wherein the synchronization header is located at a head of the codeword structure, at a tail of the codeword structure, or between the valid data and the check part, wherein the valid data comprises N data blocks, wherein N is an integer less than or equal to a ratio of a payload length value corresponding to a forward error correction (FEC) code type to a length of each of the N data blocks, and wherein a length of the check part is equal to a difference between an FEC codeword length value corresponding to the FEC code type and the payload length value;

synchronizing, at the physical coding sublayer, the codeword structure based on the synchronization header;

extracting a payload and the check part at the physical coding sublayer, wherein the payload comprises the valid data, and wherein a length of the payload is equal to the payload length value; and performing, at the physical coding sublayer, FEC decoding on the payload based on the FEC code type.

9. The data decoding method of claim 8, wherein each of the N data blocks is a 64 bit (b)/66b, 64b/65b, 128b/129b, or 256b/257b data block.

10. The data decoding method of claim 8, wherein the FEC decoding is low-density parity-check (LDPC) (18493, 15677), Reed-Solomon (RS) (2047, 1739), RS (1023, 847), RS (1023, 845), RS (1023, 843), RS (1023, 841), RS (1015, 839), RS (1017, 839), or RS (1019, 839).

11. The data decoding method of claim 8, further comprising identifying that the payload comprises the valid data when a length of the valid data is equal to the payload length value.

12. The data decoding method of claim 8, further comprising identifying that the codeword structure further comprises a padding part and the payload comprises the valid data and the padding part when a length of the valid data is less than the payload value.

13. The data decoding method of claim 8, wherein a length of the synchronization header is S, wherein each of the N data blocks is an input data block or a transcoded data block of the input data block, wherein the input data block is a 64 bit (b)/66b or 64b/65b data block, wherein a length of the input data block is X, wherein a remainder of dividing the FEC codeword length value by X is Y, wherein S=tX−Y, wherein t is an integer, wherein t≥1 when Y≠0, and wherein t≥0 when Y=0.

14. A network device in a passive optical network (PON) system comprising:

a memory configured to store instructions; and a processor coupled to the memory, wherein the instructions cause the processor to be configured to:

collect N data blocks, wherein N is an integer less than or equal to a ratio of a payload length value corresponding to a forward error correction (FEC) code type to a length of each of the N data blocks;

combine the N data blocks to generate valid data;

generate a payload, wherein the payload comprises the valid data, and wherein a length of the payload is equal to the payload length value; and perform FEC encoding on the payload based on the FEC code type to generate a check part, wherein a length of the check part is equal to a difference between a FEC codeword length value corresponding to the FEC code type and the payload length value; and generate a codeword structure, wherein the codeword structure comprises the valid data, the check part, and a synchronization header, and wherein the synchronization header is located at a head of the codeword structure, at a tail of the codeword structure, or between the valid data and the check part.

15. The network device of claim 14, wherein each of the N data blocks is a 128 bit (b)/129b or 256b/257b data block, and wherein the instructions further cause the processor to be configured to transcode an input 64b/66b or 64b/65b data block into the 128b/129b or 256b/257b data block.

16. The network device of claim 14, wherein a length of the synchronization header is S, wherein a length of the input data block is X, and a remainder obtained by dividing the FEC codeword length value by X, wherein S=tX−Y, wherein t is an integer, wherein t≥1 when Y≠0, and wherein t≥0 when Y=0.

17. The network device of claim 14, wherein each of the N data blocks is a 64b/66b or 64b/65b data block.

18. A network device in a passive optical network (PON) system comprising:

a transceiver configured to receive a codeword structure, wherein the codeword structure comprises valid data, a check part, and a synchronization header, wherein the synchronization header is located at a head of the codeword structure, at a tail of the codeword structure, or between the valid data and the check part, wherein the valid data comprises N data blocks, wherein N is an integer less than or equal to a ratio of a payload length value corresponding to a forward error correction (FEC) code type to a length of each of the N data blocks, and wherein a length of the check part is equal to a difference between the FEC codeword length value and the payload length value; and a processor coupled to the transceiver and configured to:
synchronize the codeword structure based on the synchronization header;
extract a payload and the check part, wherein the payload comprises the valid data, and wherein a length of the payload is equal to the payload length value; and
perform FEC decoding on the payload based on the FEC code type.

19. A codeword structure applied in a passive optical network (PON) system comprising valid data, a check part, and a synchronization header, and wherein the synchronization header is located at a head of the codeword structure, at a tail of the codeword structure, or between the valid data and the check part, wherein the check part is generated via performing forward error correction (FEC) encoding on a payload based on a FEC code type, wherein the payload comprises the valid data, wherein the valid data comprises an input data block or a transcoded data block of the input data block, wherein the input data block is a 64 bit (b)/66b or 64b/65b data block, wherein a length of the input data block is X, wherein a remainder obtained by dividing a FEC codeword length value corresponding to the FEC code type by X is Y, wherein S=tX−Y, wherein t is an integer, t≥1 when Y≠0, and wherein t≥0 when Y=0.

* * * * *